United States Patent
Tanaka

(10) Patent No.: US 7,346,235 B2
(45) Date of Patent: Mar. 18, 2008

(54) BEAM HOMOGENIZER, LASER IRRADIATION APPARATUS, AND METHOD FOR MANUFACTURING SEMICONDUCTOR DEVICE

(75) Inventor: Koichiro Tanaka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 11/808,044

(22) Filed: Jun. 6, 2007

(65) Prior Publication Data

US 2007/0242922 A1   Oct. 18, 2007

Related U.S. Application Data

(62) Division of application No. 10/885,635, filed on Jul. 8, 2004, now Pat. No. 7,245,802.

(30) Foreign Application Priority Data

Aug. 4, 2003   (JP)   ............................. 2003-286304

(51) Int. Cl.
    *G02B 6/26* (2006.01)
(52) U.S. Cl. .......................................... 385/31; 385/33
(58) Field of Classification Search ...................... None
    See application file for complete search history.

(56) References Cited

U.S. PATENT DOCUMENTS

| 4,733,944 A | 3/1988 | Fahlen et al. |
| 4,744,615 A | 5/1988 | Fan et al. |
| 4,793,694 A | 12/1988 | Liu |
| 4,830,447 A | 5/1989 | Kamiyama et al. |

(Continued)

FOREIGN PATENT DOCUMENTS

EP   1 063 049   12/2000

(Continued)

OTHER PUBLICATIONS

European Search Report dated Jan. 26, 2004 for Application No. 03 02 1233.6.

(Continued)

*Primary Examiner*—Sung Pak
(74) *Attorney, Agent, or Firm*—Eric J. Robinson; Robinson Intellectual Property Law Office, P.C.

(57) ABSTRACT

A cylindrical lens array cannot be manufactured so that each cylindrical lens has the same radius of curvature and the same accuracy in the surface. Therefore, when the laser annealing is performed using the cylindrical lens array, the beam spots divided by the cylindrical lens array cannot be superposed completely in the same surface. As a result, there is a region where the energy is attenuated in the edge portion of the rectangular beam to be formed, and therefore the intensity distribution of the laser beam becomes inhomogeneous. In the present invention, the cylindrical lens array is used in combination with the optical waveguide. After dividing the laser beam in a predetermined direction by the cylindrical lens array, the divided beams are combined, and then the laser beam is incident into the optical waveguide that acts upon the same direction as the predetermined direction. This can correct the variation in the intensity of the laser beam due to the processing inaccuracy of the cylindrical lens array.

40 Claims, 12 Drawing Sheets

U.S. PATENT DOCUMENTS

| | | |
|---|---|---|
| 5,080,474 A | 1/1992 | Miyamoto |
| 5,224,200 A | 6/1993 | Rasmussen et al. |
| 5,285,509 A | 2/1994 | Reeder et al. |
| 5,303,084 A | 4/1994 | Pflibsen et al. |
| 5,825,551 A | 10/1998 | Clarkson et al. |
| 5,886,313 A | 3/1999 | Krause et al. |
| 5,900,980 A | 5/1999 | Yamazaki et al. |
| 6,002,523 A | 12/1999 | Tanaka |
| 6,038,075 A | 3/2000 | Yamazaki et al. |
| 6,078,652 A | 6/2000 | Barak |
| 6,104,535 A | 8/2000 | Tanaka |
| 6,137,633 A | 10/2000 | Tanaka |
| 6,157,492 A | 12/2000 | Yamazaki et al. |
| 6,176,926 B1 | 1/2001 | Tanaka |
| 6,212,012 B1 | 4/2001 | Tanaka |
| 6,215,595 B1 | 4/2001 | Yamazaki et al. |
| 6,236,449 B1 | 5/2001 | Tanitsu |
| 6,239,913 B1 | 5/2001 | Tanaka |
| 6,291,320 B1 | 9/2001 | Yamazaki et al. |
| 6,304,385 B1 | 10/2001 | Tanaka |
| 6,310,727 B1 | 10/2001 | Tanaka |
| 6,388,812 B2 | 5/2002 | Yamazaki et al. |
| 6,393,042 B1 | 5/2002 | Tanaka |
| 6,437,284 B1 | 8/2002 | Okamoto et al. |
| 6,437,313 B2 | 8/2002 | Yamazaki et al. |
| 6,441,965 B2 | 8/2002 | Yamazaki et al. |
| 6,563,843 B1 | 5/2003 | Tanaka |
| 6,573,162 B2 | 6/2003 | Tanaka et al. |
| 6,693,257 B1 | 2/2004 | Tanaka |
| 6,738,396 B2 | 5/2004 | Filgas et al. |
| 6,785,304 B2 | 8/2004 | Filgas |
| 6,818,568 B2 | 11/2004 | Tanaka |
| 6,856,630 B2 | 2/2005 | Tanaka |
| 6,856,727 B2 | 2/2005 | Li |
| 6,943,086 B2 | 9/2005 | Hongo et al. |
| 6,961,184 B2 | 11/2005 | Yamazaki et al. |
| 7,153,359 B2 | 12/2006 | Maekawa et al. |
| 7,169,630 B2 | 1/2007 | Moriwaka |
| 2002/0196551 A1 | 12/2002 | Yamazaki et al. |
| 2004/0058553 A1 | 3/2004 | Tanaka |
| 2004/0179807 A1 | 9/2004 | Tanaka |
| 2004/0213514 A1 | 10/2004 | Yamazaki et al. |

FOREIGN PATENT DOCUMENTS

| | | |
|---|---|---|
| EP | 1 122 020 | 8/2001 |
| GB | 2 044 948 | 10/1980 |
| JP | 08-338962 | 12/1996 |
| JP | 09-234579 | 9/1997 |
| JP | 2001-291681 | 10/2001 |
| JP | 2002-184206 | 6/2002 |

OTHER PUBLICATIONS

European Search Report dated Feb. 18, 2005 for Application No. 04 00 5845.5.

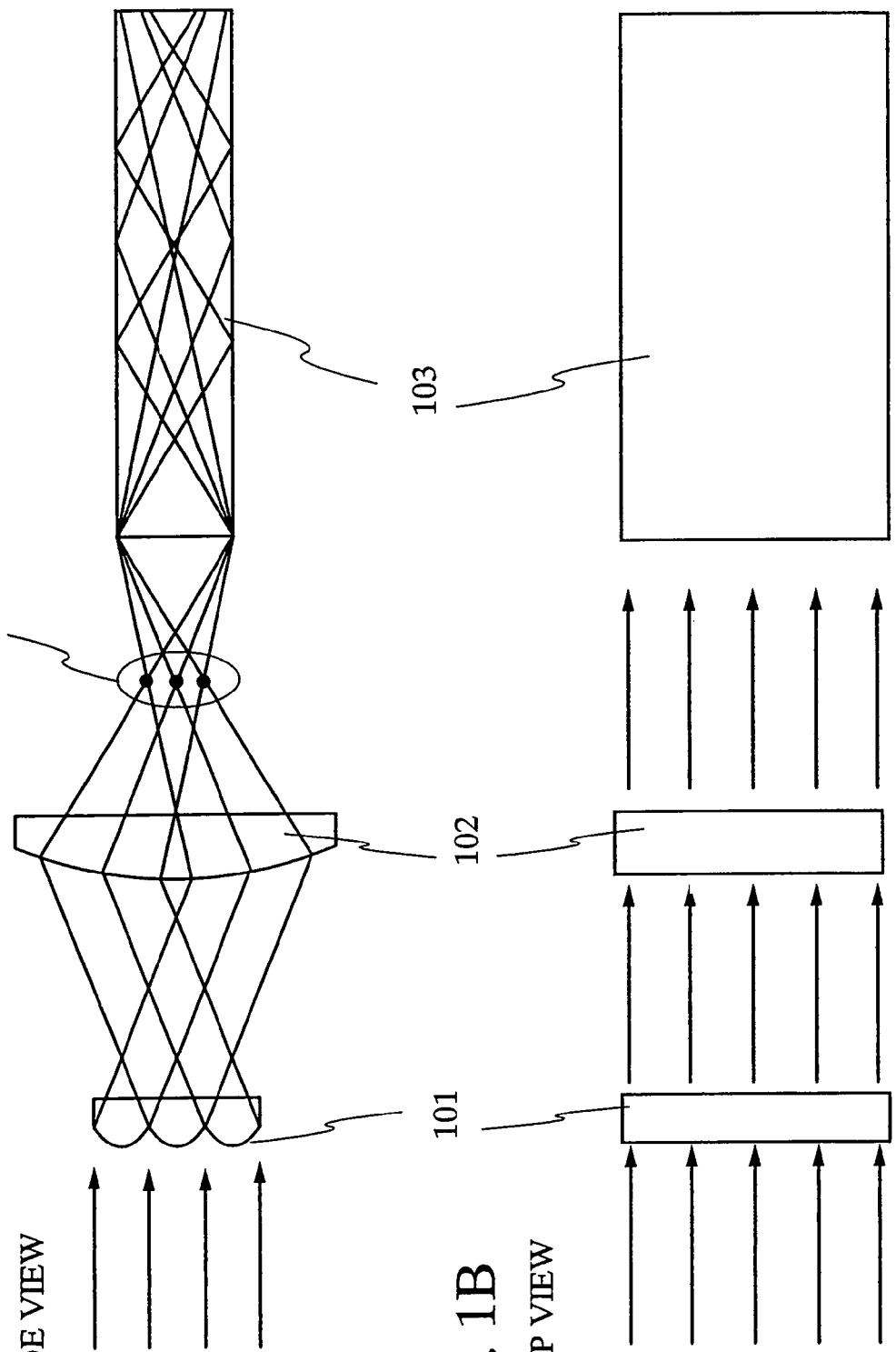

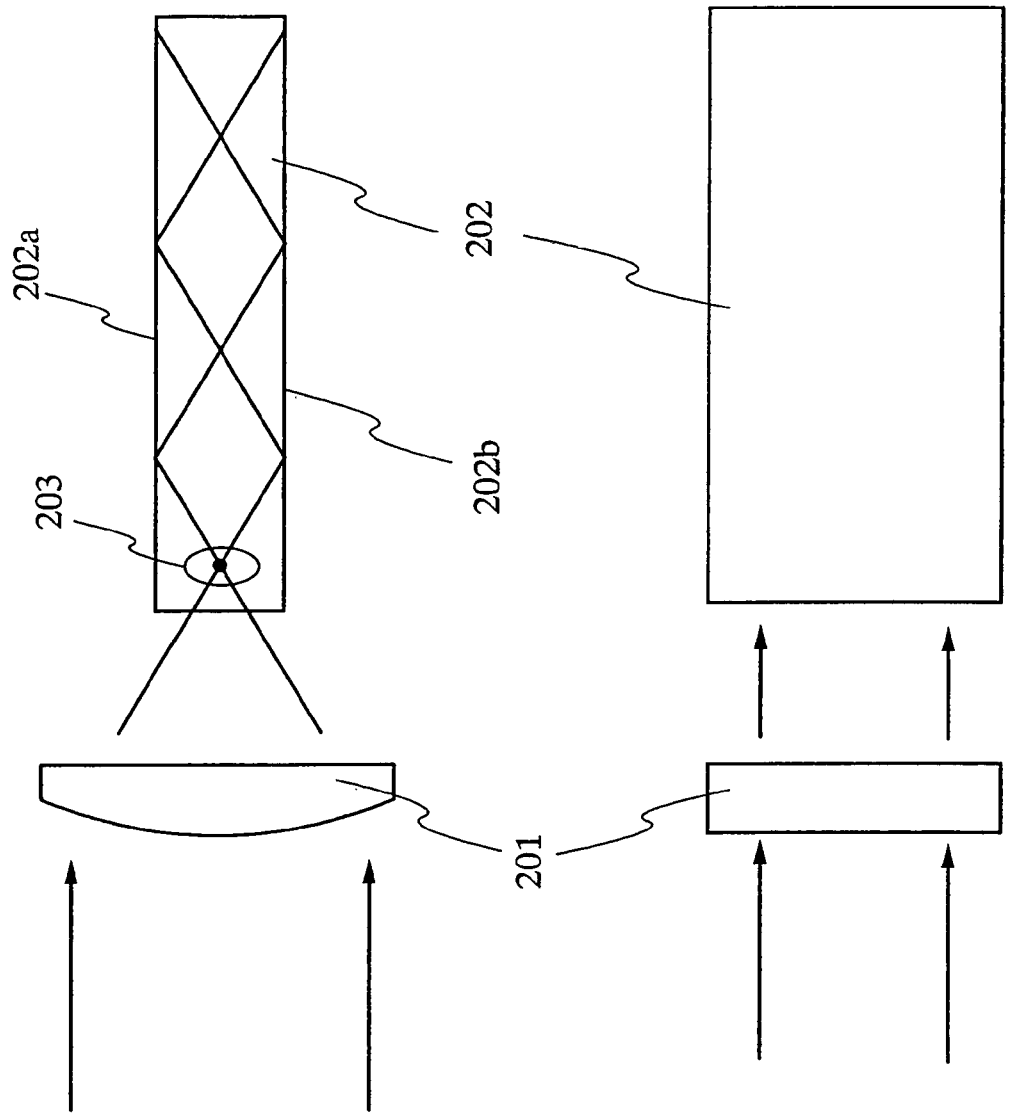
FIG. 2A SIDE VIEW
FIG. 2B TOP VIEW

SIDE VIEW

TOP VIEW

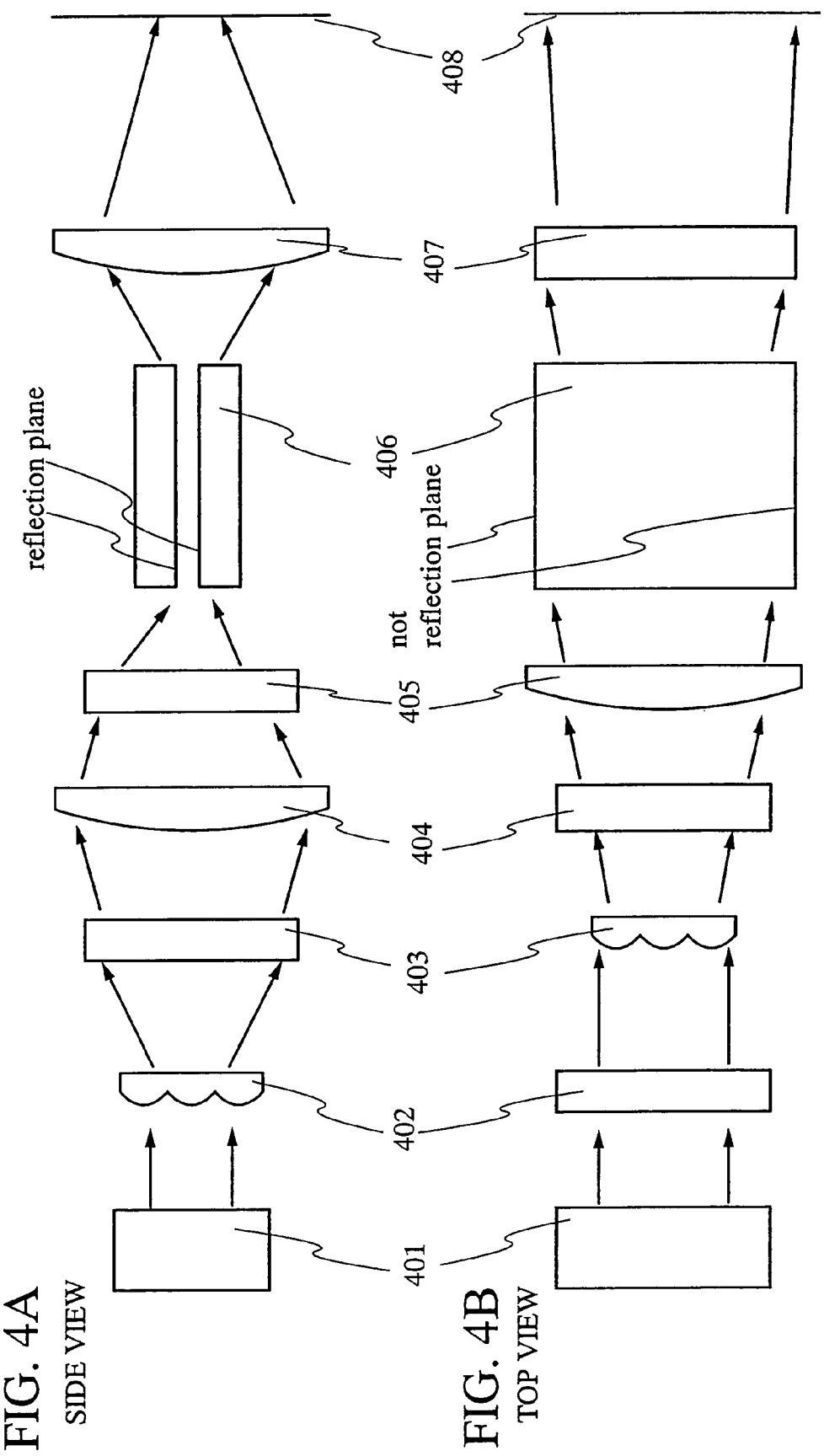
FIG. 4A SIDE VIEW
FIG. 4B TOP VIEW

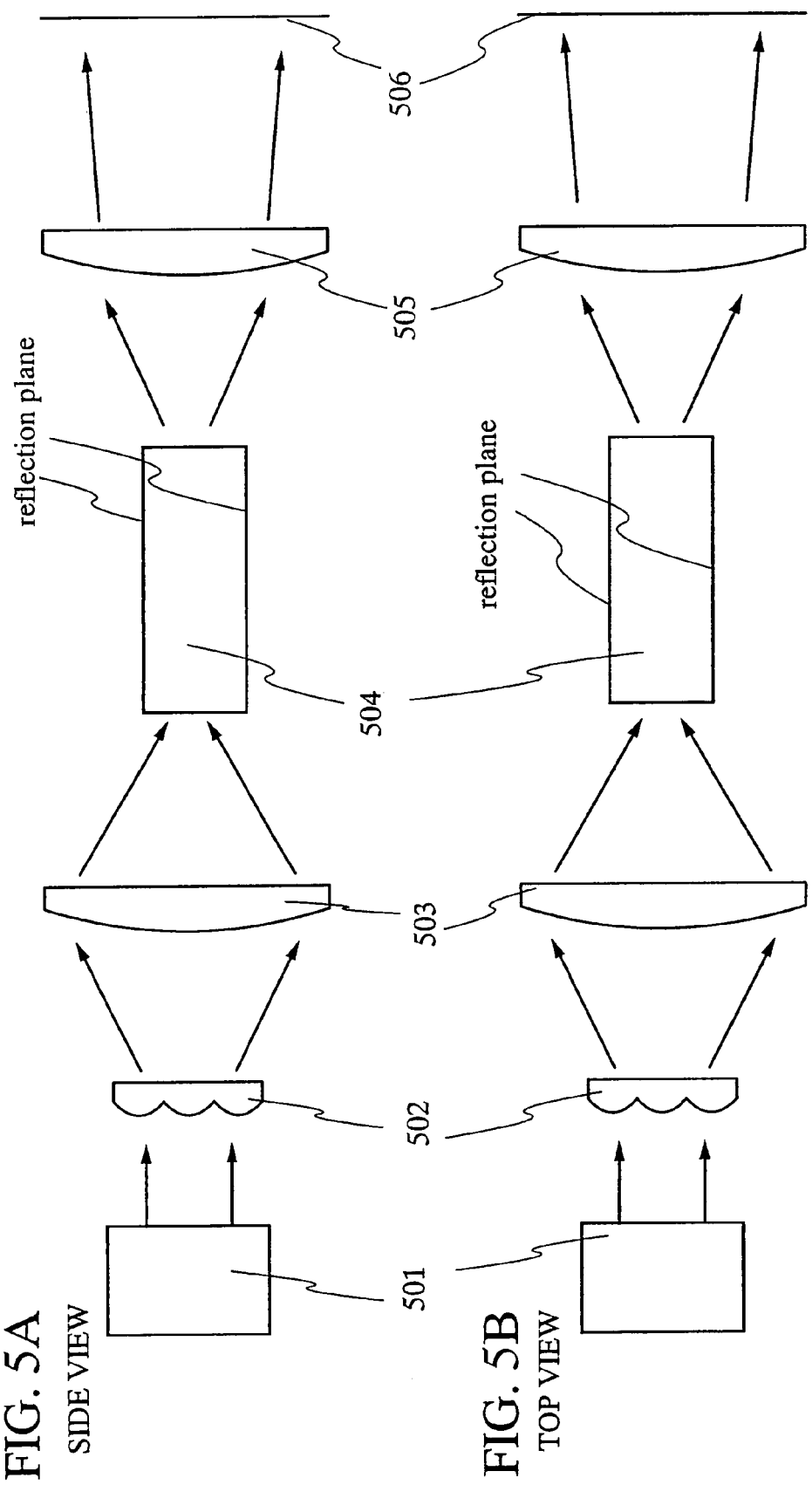

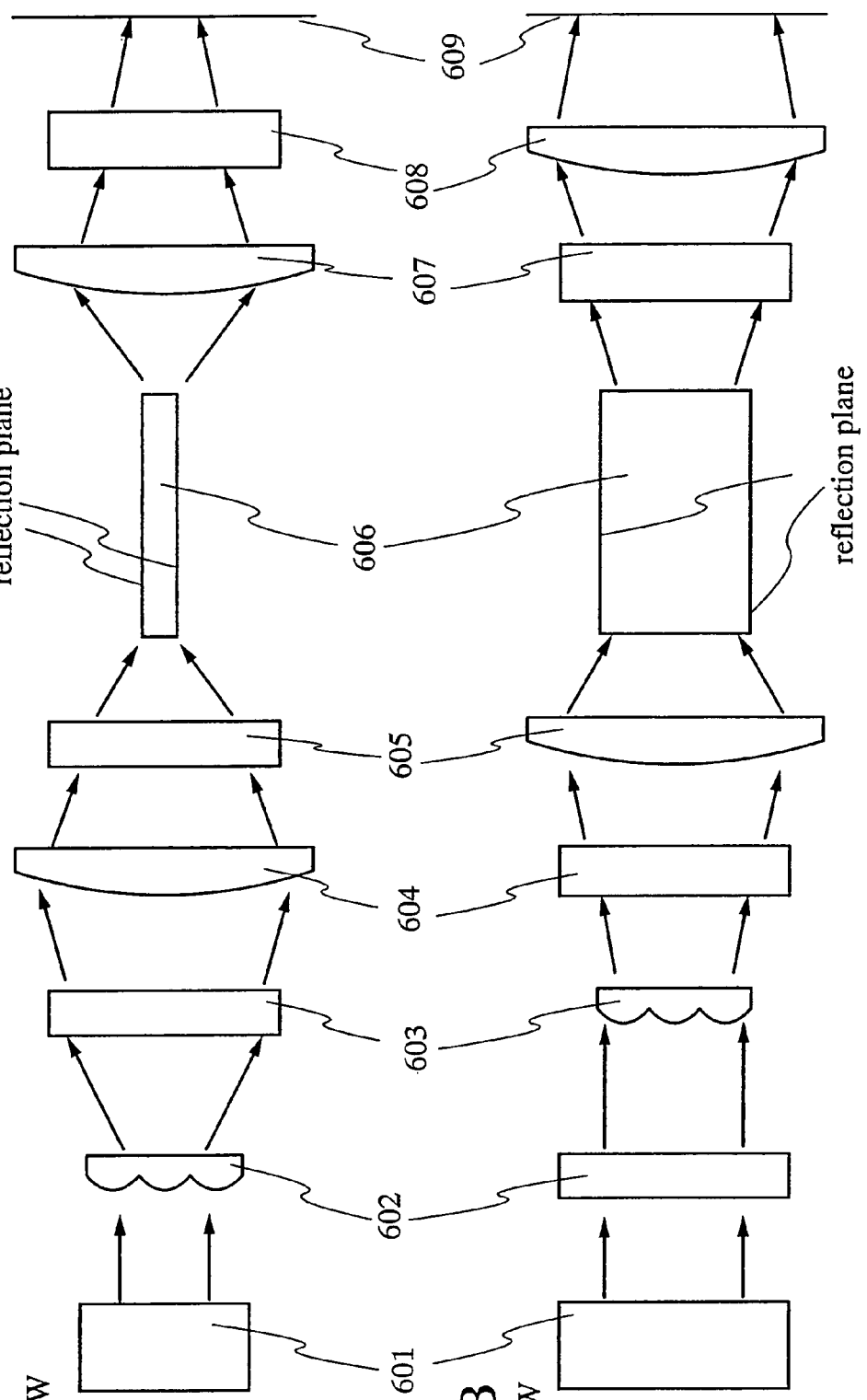
FIG. 6A SIDE VIEW
FIG. 6B TOP VIEW laser beam having inhomogeneous intensity distribution laser beam having homogeneous intensity distribution

BEAM HOMOGENIZER, LASER IRRADIATION APPARATUS, AND METHOD FOR MANUFACTURING SEMICONDUCTOR DEVICE

This application is a divisional of Ser. No. 10/885,635 filed Jul. 8, 2004, now a U.S. Pat. No. 7,245,802.

BACKGROUND OF THE INVENTION

1. Field of the Invention

The present invention relates to a beam homogenizer for homogenizing intensity distribution of a laser beam in a particular region of an irradiated surface. In addition, the present invention relates to a laser irradiation apparatus for irradiating the laser beam to the irradiated surface. Furthermore, the present invention relates to a method for manufacturing a semiconductor device having a crystalline semiconductor film formed using the laser irradiation apparatus.

2. Related Art

In recent years, a method for manufacturing a crystalline semiconductor film by irradiating a laser beam to a non-single crystal semiconductor film formed over a glass substrate has been extensively employed (this method is hereinafter referred to as laser annealing). It is noted that the term "crystalline semiconductor film" herein used means a semiconductor film having a crystallized region, and includes a semiconductor film having the crystallized region all over the surface thereof.

The glass substrate is less expensive than a synthetic quartz substrate, thereby having an advantage that a large substrate can be manufactured easily. On the other hand, the glass has a disadvantage that it has a lower melting point than the synthetic quartz. However, when the laser annealing is performed to the semiconductor film formed over the glass substrate, it is possible to give high temperature only to the semiconductor film without giving any thermal damages to the glass substrate. In addition, the laser annealing provides much higher throughput than heating means using an electrically heated oven.

Since the crystalline semiconductor film manufactured by the laser annealing has high mobility, the crystalline semiconductor film is extensively used as an active layer of TFT for a driver circuit constituting an active matrix liquid crystal display device, for example.

A laser beam emitted from an excimer laser is often employed as the laser beam. The excimer laser has advantages that it has high output, that it can oscillate the laser beam at high repetition rate, and that the absorption coefficient of the laser beam emitted from the excimer laser is high to a silicon film, which is often employed as the semiconductor film. And, the laser irradiation is performed in such a way that the laser beam is shaped through an optical system so as to have a rectangular shape on the irradiated surface, and that the irradiation position of the rectangular laser beam is moved relative to the irradiated surface. Since such a method provides a high productivity, it is superior industrially. It is noted that the laser beam having a rectangular shape on the irradiated surface is referred to as a rectangular beam in this specification.

Since the laser beam emitted from the laser oscillator has Gaussian intensity distribution in general, it is necessary to homogenize the intensity distribution of the laser beam on the irradiated surface in order to perform the uniform laser annealing. In recent years, in order to homogenize the intensity distribution, a method is often employed in which a cylindrical lens array is used to divide the laser beam in a predetermined direction and then the divided laser beams are superposed in the same surface. According to this method, a rectangular beam can be formed to have a length of 300 mm or more in the major axis and a length of 1 mm or less in the minor axis, and therefore it has become possible to perform the laser annealing efficiently to the semiconductor film formed over a large substrate.

When the cylindrical lens array is used, however, a processing accuracy of each cylindrical lens is a problem. The cylindrical lens array consists of a plurality of cylindrical lenses arranged and it is impossible to manufacture the respective cylindrical lenses so as to have the same radius of curvature and the same accuracy in their surfaces. As a result, since the beam spots divided by the cylindrical lens array cannot be superposed in the same irradiated surface completely, there is a region in the rectangular beam to be formed where the intensity distribution is attenuated. This can be a problem when performing the laser annealing to the semiconductor film. When the semiconductor film formed by the laser annealing using the rectangular beam having such inhomogeneous intensity distribution is used to manufacture a TFT, and moreover when this TFT is used to manufacture a liquid crystal or organic EL display, a stripe or a color variation may appear on the display.

SUMMARY OF THE INVENTION

The present invention is made in view of the above problem, and it is an object of the present invention to improve the homogeneity of the intensity distribution of the laser beam and to provide a technique that can correct the variation in the intensity of the laser beam particularly due to the processing inaccuracy of the cylindrical lens array.

The present invention uses an optical waveguide in combination with a cylindrical lens array which is employed for forming a rectangular shaped beam so as to obtain a rectangular beam having more uniform intensity distribution. That is to say, the variation in the intensity distribution of the laser beam due to the processing inaccuracy of the cylindrical lens array is corrected in such a way that after dividing the laser beam in a predetermined direction by the cylindrical lens array, the divided beams are combined and then the laser beam is introduced into the optical waveguide that acts in the same direction as the predetermined direction.

When a pair of reflection planes is provided oppositely in the optical waveguide, the predetermined direction is made to conform to the direction of the minor axis of the rectangular beam to be formed. The reason why the optical waveguide is made to act in the direction of the minor axis of the rectangular beam is as follows. The rectangular beam that is often employed for the laser annealing to the semiconductor film has an extremely short minor axis, which is 1 mm or less in general. In order to homogenize the intensity distribution of the laser beam in the direction of the minor axis of such an extremely narrow rectangular beam, the divided beam spots must be superposed at very high accuracy. It is the optical waveguide that makes such a superposition possible easily, and the divided beam spots can be superposed in the same position completely.

Moreover, when the optical waveguide has another pair of reflection planes provided oppositely in the direction of the major axis, the rectangular beam can have homogeneous intensity distribution in the directions of its major and minor axes.

In order to solve the above problem, the present invention provides a beam homogenizer including an optical system for dividing the laser beam in the predetermined direction and for combining the divided laser beams, and an optical waveguide for homogenizing intensity distribution of the laser beam in the predetermined direction, wherein the laser beam is incident into the optical waveguide after transmitting through the optical system.

The beam homogenizer disclosed in the present invention further includes an optical system for dividing the laser beam in a direction perpendicular to the predetermined direction and for combining the divided beams.

In the beam homogenizer disclosed in the present invention, the optical waveguide has a pair of reflection planes provided oppositely.

In the beam homogenizer disclosed in the present invention, the optical waveguide has two pairs of reflection planes provided oppositely.

The present invention discloses a laser irradiation apparatus including a laser oscillator and a beam homogenizer, wherein the beam homogenizer has an optical system for dividing a laser beam in a predetermined direction and for combining the divided beams, and an optical waveguide for homogenizing intensity distribution of the laser beam in the predetermined direction, and wherein the laser beam is incident into the optical waveguide after transmitting through the optical system.

The laser irradiation apparatus disclosed in the present invention further includes an optical system for dividing the laser beam in a direction perpendicular to the predetermined direction and for combining the divided laser beams.

In the laser irradiation apparatus disclosed in the present invention, the optical waveguide has a pair of reflection planes provided oppositely.

In the laser irradiation apparatus disclosed in the present invention, the optical waveguide has two pairs of reflection planes provided oppositely.

In the laser irradiation apparatus disclosed in the present invention, the laser oscillator is an excimer laser, a YAG laser, or a glass laser.

In the laser irradiation apparatus disclosed in the present invention, the laser oscillator is a $YVO_4$ laser, a YLF laser, or an Ar laser.

The laser irradiation apparatus disclosed in the present invention further includes a moving stage for moving an irradiated surface relative to the laser beam.

The laser irradiation apparatus disclosed in the present invention further includes a transfer device for transferring the irradiated surface to the moving stage.

The present invention discloses a method for manufacturing a semiconductor device including the steps of forming a non-single crystal semiconductor film over a substrate and performing laser annealing to the non-single crystal semiconductor film as an irradiated surface, wherein the laser annealing includes the steps of dividing the laser beam in the predetermined direction and combining the divided beams by an optical system, homogenizing intensity distribution of the laser beam in the predetermined direction by an optical waveguide, and irradiating the non-single crystal semiconductor film while moving the laser beam relative to the non-single crystal semiconductor film.

In the method for manufacturing a semiconductor device disclosed in the present invention, an optical system for dividing the laser beam in a direction perpendicular to the predetermined direction and for combining the divided beams is used.

The optical waveguide used in the method for manufacturing a semiconductor device disclosed in the present invention has a pair of reflection planes provided oppositely.

The optical waveguide used in the method for manufacturing a semiconductor device disclosed in the present invention has two pairs of reflection planes provided oppositely.

The laser oscillator used in the method for manufacturing a semiconductor device disclosed in the present invention is an excimer laser, a YAG laser, or a glass laser.

The laser oscillator used in the method for manufacturing a semiconductor device disclosed in the present invention is a $YVO_4$ laser, a YLF laser, or an Ar laser.

In the method for manufacturing a semiconductor device disclosed in the present invention, a moving stage for moving the irradiated surface relative to the laser beam is used.

In the method for manufacturing a semiconductor device disclosed in the present invention, a transfer device for transferring the irradiated surface to the moving stage is used.

Advantageous Effect of the Invention

According to the present invention, with the optical system for dividing and combining the laser beam, the divided beams are focused at the different points respectively, and therefore the intensity distribution is dispersed at the respective focal points without forming the point having extremely high intensity. Moreover, since the focal point can be set at a distance from the optical waveguide by adjusting the position of the optical system, the laser beam is not focused inside the optical waveguide. Therefore, the optical waveguide is unlikely to be damaged. Since the intensity distribution is dispersed at the focal points as described above even when the laser beam is focused inside the optical waveguide because of, for example, the change in the divergence angle of the laser beam, the optical waveguide is unlikely to be damaged. The intensity distribution of the laser beam is homogenized in such a way that the laser beam incident into the optical waveguide transmits therethrough while the intensity distribution is dispersed, and that the divided laser beams are superposed in the same surface. The intensity distribution of the laser beam is homogenized at the exit of the optical waveguide where the divided laser beams are superposed. Because the intensity distribution of the laser beam is dispersed, a transmission type optical waveguide can be used, and the loss in the photoconduction can be decreased.

In addition, since the laser beam can have homogeneous intensity distribution, it is possible to have a wide margin of the power of the laser beam. FIGS. 7A and 7B explain this. FIG. 7A shows a shape of the laser beam having inhomogeneous intensity distribution. Generally, the power of the laser beam is not always stable and varies to some extent. In the case where the laser annealing is performed using the laser beam having inhomogeneous intensity distribution, when the power increases unexpectedly, the top of the beam profile exceeds the energy range that is appropriate for the crystallization. Therefore, when the laser annealing is performed to the semiconductor film as the irradiated object, the semiconductor film may be ablated. Conversely, when the power decreases, the bottom of the beam profile originally having the low energy falls below the energy range that is appropriate for the crystallization. Therefore, the crystallization may not be performed due to the insufficient energy. On the other hand, as shown in FIG. 7B, when the laser beam having homogeneous intensity distribution is used, even though the power varies to some extent, the laser beam does not exceed or fall below the energy range that is appropriate for the crystallization. Thus, uniform crystallization can be performed stably. For these reasons, with the laser beam having homogeneous intensity distribution formed by the present invention, the laser annealing can be performed in a wide margin of the power of the laser beam.

When the laser annealing is performed using the laser irradiation apparatus including the beam homogenizer disclosed in the present invention, the intensity distribution of the laser beam can be homogenized at the irradiated surface. Therefore, the uniformity of the crystallinity over the substrate can be enhanced. When the present invention is applied in the mass production of TFT, it is possible to manufacture TFT having high operating characteristic efficiently because the uniform crystallinity can reduce the variation in the electrical characteristic and enhance the reliability.

With these advantages satisfied, the operating characteristic and the reliability in the semiconductor device typified by an active matrix liquid crystal display device can be enhanced. Moreover, the manufacturing process of the semiconductor device can have a wide margin to boost the yield. Therefore, the semiconductor device can be manufactured at lower cost.

BRIEF DESCRIPTION OF THE DRAWINGS

In the accompanying drawings:

FIGS. 1A and 1B show the embodiment mode of the present invention;

FIGS. 2A and 2B show the embodiment mode of the present invention;

FIGS. 4A and 4B show the embodiment 1 of the present invention;

FIGS. 5A and 5B show the embodiment 2 of the present invention;

FIGS. 6A and 6B show the embodiment 3 of the present invention;

DETAILED DESCRIPTION OF THE INVENTION

Figures 3A, 3B:
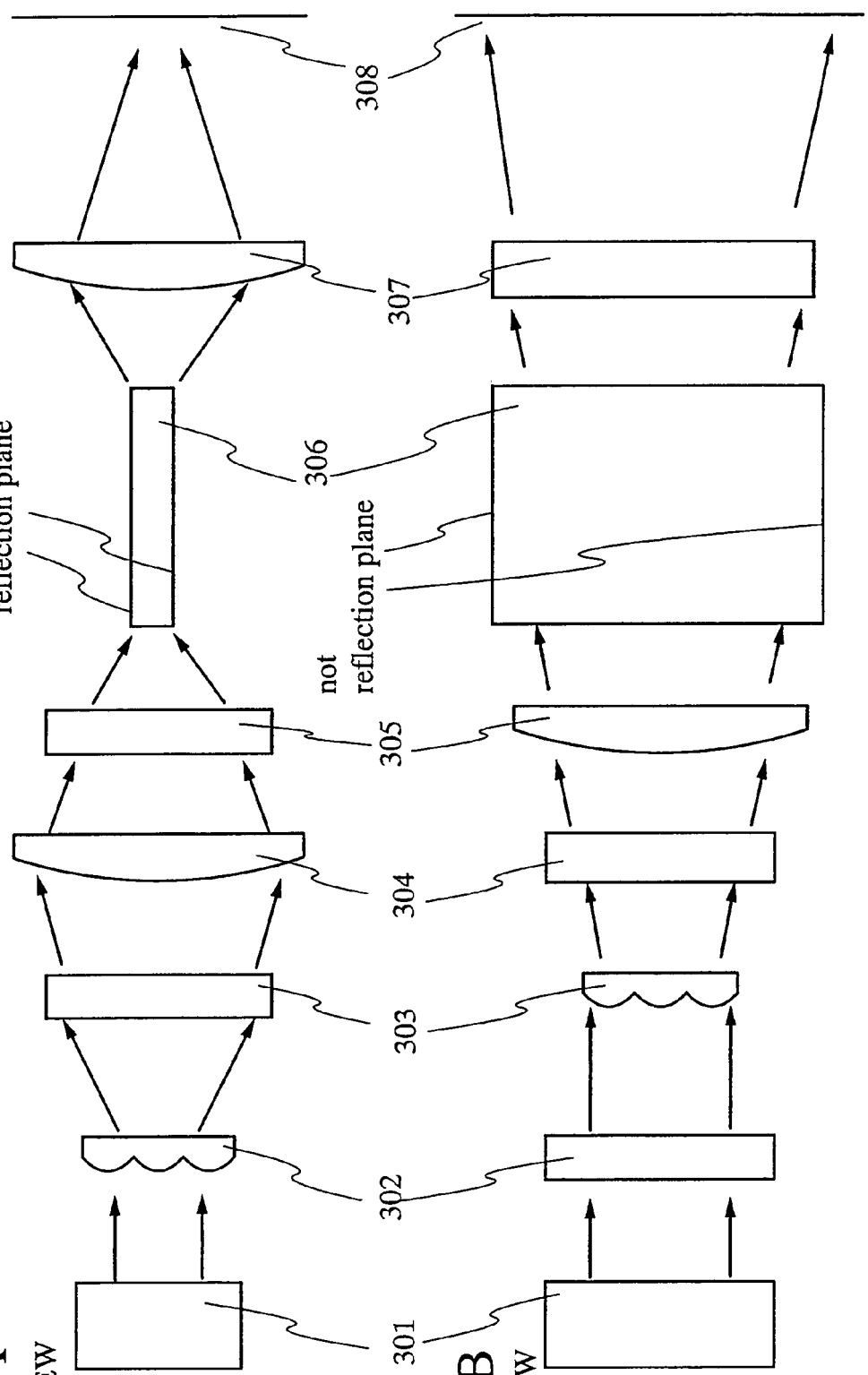
FIGS. 3A and 3B show the embodiment mode of the present invention.
Figure 7A:
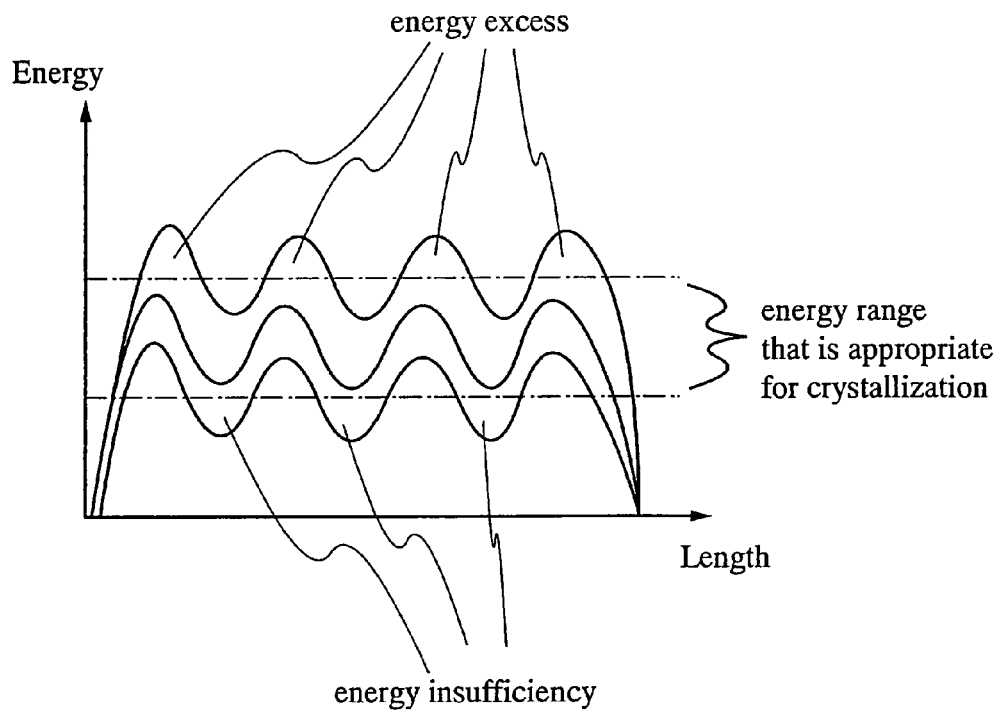
FIGS. 7A and 7B show the advantageous effect of the invention.
Figure 7B:
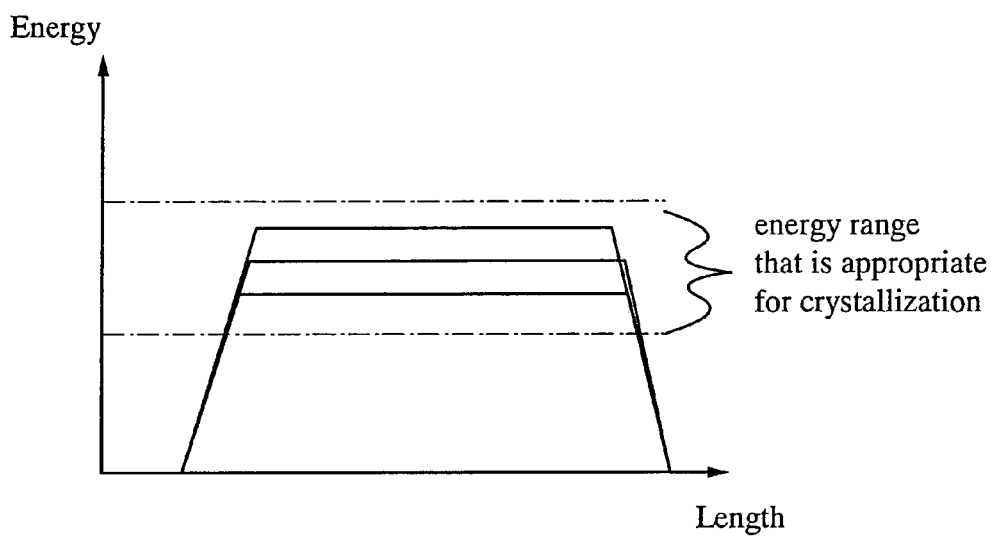

First of all, a method for homogenizing intensity distribution of a laser beam by the beam homogenizer disclosed in the present invention is explained with reference to FIGS. 1A to 2B. In a side view of FIG. 1A, the laser beam propagates in the direction indicated by an arrow. A cylindrical lens array 101 and a convex cylindrical lens 102 are used as an optical system for dividing the laser beam and for combining the divided laser beams. An optical waveguide 103 has a pair of reflection planes provided oppositely with a region therebetween occupied by the medium having a refractive index of n (n>1). Therefore, the laser beam incident into the optical waveguide 103 is totally reflected by being incident thereinto at a critical angle or more according to the same principal as an optic fiber. For example, by providing the optical waveguide made of quartz (refractive index is approximately 1.5) in the air, the optical waveguide having a total-reflection plane at the interface between the optical waveguide and the air can be obtained. With such an optical waveguide, the transmittance of the laser beam becomes extremely higher than an optical waveguide where the laser beam is not totally reflected. Thus, the laser beam emitted from the laser oscillator can propagate to the irradiated surface more efficiently. In addition, the optical waveguide may have two pairs of reflection planes provided oppositely. Moreover, an optical waveguide having the air to occupy the region between the pair of reflection planes may be also employed.

In a side view of FIG. 1A, the laser beam is divided by the cylindrical lens array 101, and the divided laser beams are focused by the convex cylindrical lens 102, and then the laser beam is incident into the optical waveguide 103. On this occasion, since the divided laser beams are focused not at one point but at different points 104 respectively, the intensity distribution is dispersed at the respective focal points. In addition, the focal points 104 can be set at a distance from the optical waveguide by adjusting the positions of the cylindrical lens array 101 and the convex cylindrical lens 102. Therefore, the optical waveguide can be kept safe because the laser beam is not focused inside the optical waveguide. Moreover, even when the focal points 104 move to the inside of the optical waveguide 103 due to the slight change in the divergence angle of the laser beam, it is unlikely to damage the optical waveguide because the laser beams are focused not at one point but at a plurality of points where the intensity distribution of the laser beam is dispersed. Thus, it is possible to use the optical waveguide safely and to form the laser beam whose intensity distribution is homogenized at the exit thereof.

On the other hand, FIGS. 2A and 2B show an example using only the convex cylindrical lens to condense the laser beam so that the laser beam is incident into the optical waveguide. In FIGS. 2A and 2B, the laser beam propagates in the direction indicated by an arrow. A convex cylindrical lens 201 condenses the laser beam so as to make the laser beam incident into an optical waveguide 202. The optical waveguide 202 is made of the medium having a refractive index of n (n>1) as well as the optical waveguide 103 shown in FIGS. 1A and 1B. Since the optical waveguide has higher refractive index than the air, the laser beam transmits through the optical waveguide 202 while it is totally reflected at interfaces 202a and 202b between the optical waveguide 202 and the air at a critical angle or more. The laser beam is reflected repeatedly in the optical waveguide 202, and the laser beams are superposed at the exit of the optical waveguide 202. Since the laser beam condensed by the convex cylindrical lens 201 is focused at one point (a focal point 203), the intensity of the laser beam is concentrated at the focal point 203. When the divergence angle of the laser beam changes slightly to move the focal point 203 to the inside of the optical waveguide 202 as shown in FIGS. 2A and 2B, in the case of using the laser beam of high output, high electric field or plasma is generated at the point where the laser beam has high intensity, which leads to the damage of the optical waveguide.

For these reasons, in the present embodiment mode, the intensity distribution of the laser beam is dispersed by dividing the focal point using the cylindrical lens array and the convex cylindrical lens. Thus, it becomes possible to make the laser beam incident into the optical waveguide without giving any damages to the optical waveguide. It is noted that the laser beam can be homogenized only in one direction in FIGS. 1A and 1B. In order to shape the laser beam into rectangular actually, an optical system having the cylindrical lens array and the convex cylindrical lens that are rotated by 90° may be added as shown in FIGS. 3A and 3B.

Next, an optical system for forming a rectangular beam using the above beam homogenizer is explained with reference to FIGS. 3A and 3B.

First, a side view of FIG. 3A is explained. In FIG. 3A, the direction perpendicular to the paper is a direction of the major axis of the rectangular beam. The laser beam emitted from a laser oscillator 301 propagates in the direction indicated by an arrow. After the laser beam is divided by a cylindrical lens array 302 in the direction of minor axis of the rectangular beam, the divided beams are condensed by a cylindrical lens 304, and then the laser beam is incident into an optical waveguide 306. The optical waveguide 306 has a pair of reflection planes provided oppositely, which is set so as to act in the direction of the minor axis of the rectangular beam according to the reason described above.

Thus, the laser beam having homogeneous intensity distribution in the direction of the minor axis is formed at the exit of the optical waveguide 306. And, the length of the rectangular beam in the direction of the minor axis is determined by a convex cylindrical lens 307, and then the rectangular laser beam is irradiated to an irradiated surface 308.

Next, a top view of FIG. 3B is explained. In FIG. 3B, a laser beam emitted from a laser oscillator 301 is divided by a cylindrical lens array 303 in the direction of the major axis of the rectangular beam. Moreover, the divided beams are condensed by a convex cylindrical lens 305 to determine the length of the rectangular beam in the direction of the major axis, and then the rectangular laser beam is irradiated to the irradiated surface 308. Thus, the rectangular beam having the intensity distribution homogenized in the directions of the major and minor axes can be formed on the irradiated surface 308.

In this way, the optical waveguide can be used safely and the laser beam having the intensity distribution homogenized in the directions of the major and minor axes can be formed. With such a laser beam, the laser annealing can be performed uniformly to the irradiated object. For example, when a semiconductor film is employed as the irradiated object and when the laser annealing is performed thereto, it is possible to crystallize the semiconductor film uniformly, to obtain a crystalline semiconductor film having uniform crystallinity, and to activate an impurity.

In addition, when the number of arrays in the cylindrical lens array increases, the number of divided beams increases. Therefore, the advantageous effect obtained by dispersing the intensity distribution of the laser beam increases.

EMBODIMENT 1

The present embodiment explains an example using a different optical waveguide from that described in the embodiment mode with reference to FIGS. 4A and 4B.

In FIGS. 4A and 4B, the laser beam propagates in the direction indicated by an arrow. An optical waveguide 406 used in the present embodiment has a pair of reflection planes provided oppositely. In contrast with the optical waveguide 306 explained in FIGS. 3A and 3B, which is made of the medium having a refractive index of n (n>1) to occupy the region between the pair of reflection planes, the optical waveguide 406 in FIGS. 4A and 4B has a hollow space between the pair of reflection planes, which is filled with the air. The optical waveguides 306 and 406 are different in this point. In addition, the pair of reflection planes of the optical waveguide 406 is arranged so as to act in the direction of the minor axis of the rectangular beam according to the reason explained above. In a side view of FIG. 4A, the direction perpendicular to the paper is the direction of the major axis of the rectangular beam formed on the irradiated surface 308.

In a side view of FIG. 4A, the laser beam emitted from a laser oscillator 401 is divided in the direction of the minor axis of the rectangular beam by a cylindrical lens array 402. The divided laser beams are condensed by a convex cylindrical lens 404 so as to make the laser beam incident into the optical waveguide 406. Since the divided laser beams are focused at the different points on this occasion, the intensity of the laser beam is dispersed at the respective focal points. This can prevent the optical element from being damaged even though the focal points contact the optical element unexpectedly. The laser beam transmits through the optical waveguide 406 and the intensity distribution of the laser beam is homogenized at the exit of the optical waveguide 406 in the direction of the minor axis of the rectangular beam. The length of the rectangular beam in the direction of the minor axis is determined by a convex cylindrical lens 407 and the rectangular laser beam is irradiated to an irradiated surface 408.

Next, in a top view of FIG. 4B, the laser beam emitted from the laser oscillator 401 is divided in the direction of the major axis of the rectangular beam by a cylindrical lens array 403. The divided laser beams are condensed by a convex cylindrical lens 405 to determine the length thereof in the direction of the major axis and then it is irradiated to the irradiated surface 408.

Thus, a rectangular beam having the intensity distribution homogenized in the directions of the major and minor axes is formed at the irradiated surface 408.

EMBODIMENT 2

The present embodiment explains an example using the different optical system and the different optical waveguide from those described in the embodiment mode with reference to FIGS. 5A and 5B. In this embodiment, a fly-eye lens is used as a lens array. The fly-eye lens is different from the cylindrical lens array in that a plurality of spherical lenses is arranged in a matrix in the vertical plane with respect to the traveling direction of the laser beam. The optical waveguide 504 has two pairs of reflection planes provided oppositely with a region therebetween occupied by the synthetic quartz. Since the refractive index of the synthetic quartz is different from that of the air, the laser beam is reflected repeatedly in the optical waveguide 504. Specifically, in this case, because the synthetic quartz has higher refractive index than the air, the laser beam is totally reflected in the optical waveguide 504 repeatedly at a critical angle or more, and reaches the exit.

Figure 8A:
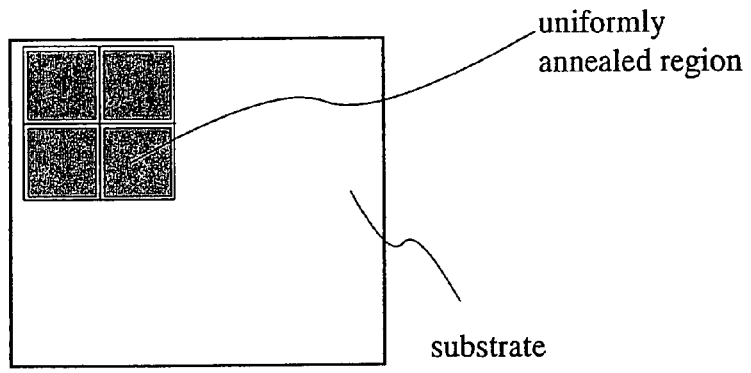
FIGS. 8A and 8B show the embodiment 2 of the present invention.
Figure 8B:
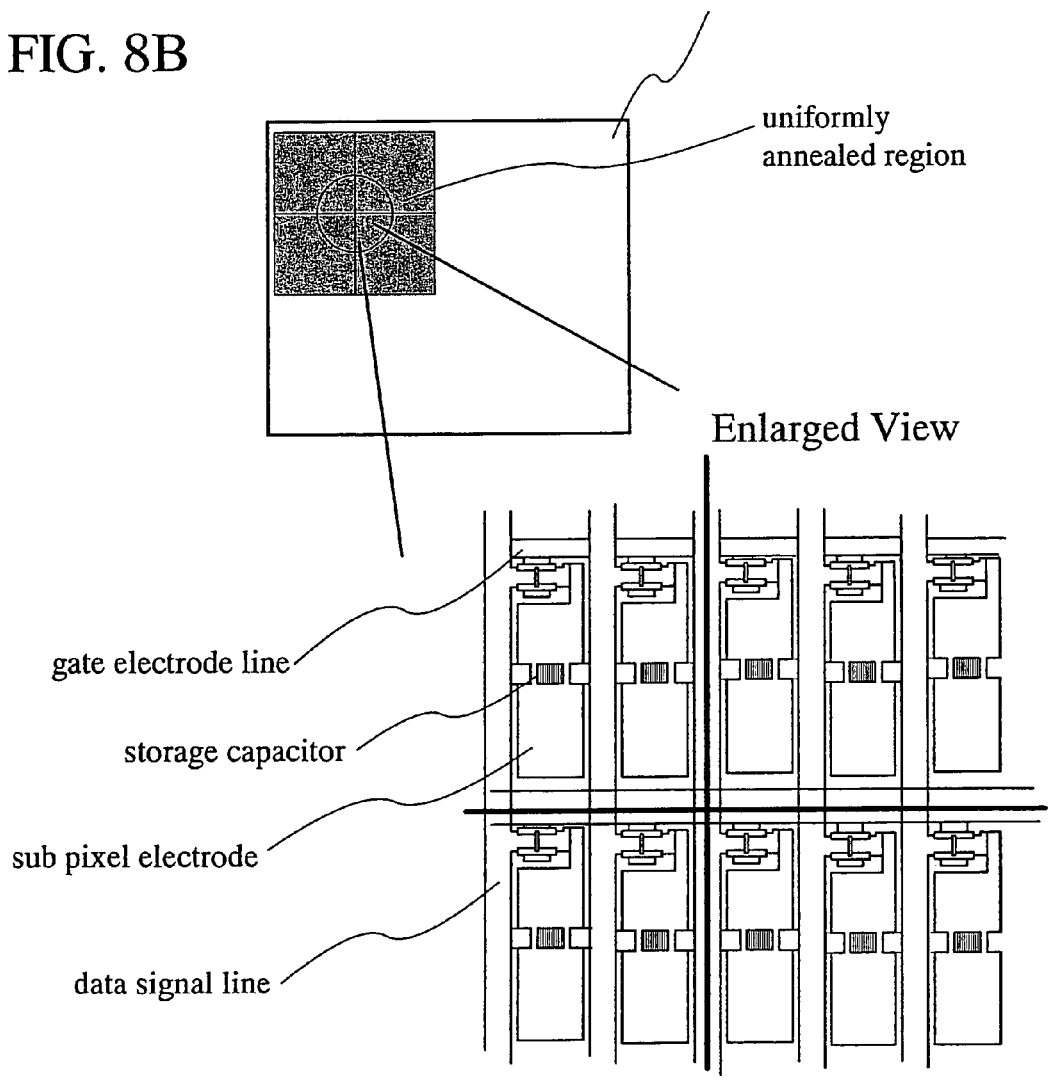

In FIGS. 5A and 5B, the laser beam propagates in the direction indicated by an arrow. In FIGS. 5A and 5B, the laser beam emitted from a laser oscillator 501 is divided horizontally and vertically by a fly-eye lens 502, and then the divided laser beams are condensed by a spherical lens 503. In contrast with the cylindrical lens, which can condense the laser beam only in one direction, the convex spherical lens can condense the laser beam in every direction, and the cylindrical lens array and the fly-eye lens are different in this point. On this occasion, since the laser beam is divided by the fly-eye lens 502, the divided laser beams are focused not at one point but at the different points respectively. Since the intensity distribution of the laser beam is dispersed at these focal points, there are no points where the intensity is extremely high. Then, the laser beam is incident into the optical waveguide 504. Since the optical waveguide 504 has two pairs of reflection planes provided oppositely, a square shaped laser beam having the intensity distribution homogenized is formed at the exit of the optical waveguide 504. After the laser beam emitted from the optical waveguide 504 is adjusted in size according to the intended purpose by a spherical lens 505, the laser beam is irradiated to the irradiated surface 506 with the uniform intensity. In the present embodiment, as shown in FIG. 8B, the laser beam is irradiated to a non-single crystal semiconductor film formed over a glass substrate as the irradiated surface in such a way that after the laser beam is irradiated in the same point for 10 shots, the irradiated surface is moved horizontally or vertically by the length of a side of the square shaped beam spot, and then the laser annealing is performed in the same way. It is noted that a practitioner may determine the number of shots according to the device to be manufactured.

According to the present invention, it is possible to form a rectangular beam having a sharp edge in the intensity distribution. In the present embodiment, it is possible to form a square shaped beam having the sharp edge in the intensity distribution on the irradiated surface 506. FIG. 8A shows an example of a substrate annealed by a laser beam not having the sharp edge in the intensity distribution, and FIG. 8B shows an example of a substrate annealed by a laser beam having the sharp edge in the intensity distribution. In FIG. 8A, since the laser beam does not have the sharp edge in the intensity distribution, the region annealed uniformly is small in each beam spot, which means the region that can be used is small. On the other hand, in the present embodiment as shown in FIG. 8B, the region that can be used in the each square shaped beam spot is large. Therefore, in the case where TFT is manufactured over the substrate after performing the laser annealing thereto, more TFT can be manufactured. Moreover, as shown in the enlarged view, TFT can be manufactured across the boundary between the beam spots at the same interval as in the beam spot. Thus, when a liquid crystal panel is manufactured using such a substrate, for example, it is possible to manufacture a panel having no unevenness.

Although the square shaped beam is formed in the present embodiment, a rectangular beam can be formed by changing the width of the optical waveguide in the vertical or horizontal direction.

EMBODIMENT 3

The present embodiment explains an example using the different optical waveguide from that described in the embodiment mode with reference to FIGS. 6A and 6B. In FIGS. 6A and 6B, a cylindrical lens array 602 is used as a lens array. An optical waveguide 606 has two pairs of reflection planes provided oppositely with a region therebetween occupied by the synthetic quartz. Since the synthetic quartz has higher refractive index than the air, the laser beam incident into the optical waveguide 606 is totally reflected repeatedly and reaches the exit.

In FIGS. 6A and 6B, the laser beam emitted from a laser oscillator 601 propagates in the direction indicated by an arrow. Firstly, a side view of FIG. 6A is explained. In the side view of FIG. 6A, the direction perpendicular to the paper is the direction of the major axis of the rectangular beam. The laser beam is incident into a cylindrical lens array 602, and is divided in the direction of the minor axis of the rectangular beam. After that, the laser beam is condensed by a convex cylindrical lens 604. On this occasion, since the laser beam is divided by the cylindrical lens array 602, the divided laser beams are focused at the different points respectively. Therefore, the intensity distribution of the laser beam is dispersed at the respective focal points and there are no points where the intensity is extremely high. The laser beam is then incident into an optical waveguide 606. The laser beam is reflected repeatedly in the optical waveguide 606, and the intensity distribution of the rectangular laser beam is homogenized at the exit of the optical waveguide 606 in the direction of the minor axis of the rectangular laser beam. After that, the length of the rectangular beam is determined by a convex cylindrical lens 607, and the rectangular laser beam is irradiated to an irradiated surface 609.

Next, a top view of FIG. 6B is explained. The laser beam emitted from the laser oscillator 601 is divided by a cylindrical lens array 603 in the direction of the major axis of the rectangular beam, and then it is condensed by a convex cylindrical lens 605. After that, it is incident into the optical waveguide 606. On this occasion, since the laser beams are focused at a plurality of points, the intensity distribution is dispersed without forming any points having extremely high intensity. Thus, the optical waveguide can be used safely. Moreover, since the optical waveguide 606 has two pairs of reflection planes provided oppositely, the intensity distribution can be homogenized not only in the direction of the minor axis but also in the direction of the major axis. Thus, a rectangular beam having the intensity distribution homogenized in the directions of the major and minor axes can be formed at the exit of the optical waveguide 606. And, the length thereof in the direction of the major axis is determined by the convex cylindrical lens 608 and then the rectangular laser beam is irradiated to the irradiated surface 609.

Thus, a rectangular laser beam having the intensity distribution homogenized in the directions of the major and minor axes can be formed using the cylindrical lens array and the optical waveguide having two pairs of reflection planes provided oppositely. In the present embodiment, the intensity distribution of the laser beam can be dispersed by dividing the laser beam using the cylindrical lens array. Therefore, the optical waveguide is unlikely to be damaged, thereby performing the laser annealing more safely.

EMBODIMENT 4

The present embodiment explains an example where the laser irradiation apparatus of the present invention is used to form a crystalline semiconductor film, and further to manufacture a semiconductor device with reference to FIGS. 9 to 11.

Figure 9A:
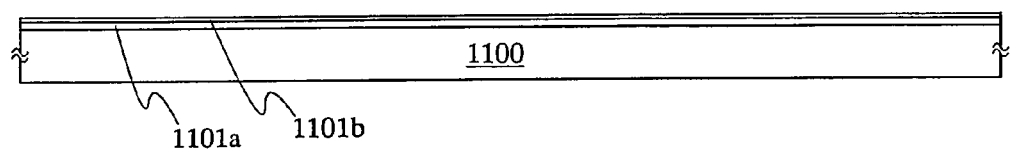
FIGS. 9A to 9D show embodiment 4 of the present invention.

Initially, base insulating films 1101a and 1101b are formed on a substrate 1100 as shown in FIG. 9A. As the substrate 1100, an insulating substrate such as a glass substrate, a quartz substrate, or a crystalline glass substrate, a ceramic substrate, a stainless substrate, a metal substrate (such as tantalum, tungsten, molybdenum, or the like), a semiconductor substrate, a plastic substrate (such as polyimide, acrylic, polyethylene terephthalate, polycarbonate, polyarylate, polyethersulfone, or the like) can be used. The substrate is formed of the material at least that can resist the heat generated in the process. In this embodiment, the glass substrate is used.

The base insulating films 1101a and 1101b are formed of a silicon oxide film, a silicon nitride film, a silicon oxynitride film, or the like in a single-layer structure or in a laminated-layer structure of two or more layers. These films are formed by a known method such as a sputtering method, a reduced-pressure CVD method, or a plasma CVD method. Although the base insulating film is formed in a two-layers structure in the present embodiment, it may be formed in a single-layer structure or in a laminated-layer structure of three or more layers. In this embodiment, a silicon nitride oxide film is formed in 50 nm thick as the first base insulating film 1101a, and a silicon oxynitride film is formed in 100 nm thick as the second base insulating film 1101b. It is noted that the silicon nitride oxide film and the silicon oxynitride film are different in the proportion between nitrogen and oxygen. The silicon nitride oxide film contains more nitrogen than oxygen, while the silicon oxynitride film contains more oxygen than nitrogen.

Next, an amorphous semiconductor film 1102 is formed. The amorphous semiconductor film may be formed using silicon or a silicon-based material (for example, $Si_xGe_{1-x}$) in thickness from 25 nm to 80 nm by the known method such as the sputtering method, the reduced-pressure CVD method, or the plasma CVD method. In this embodiment, amorphous silicon is formed in 66 nm thick.

Subsequently, the amorphous silicon is crystallized. In this embodiment, a laser annealing method is employed for crystallization.

The laser irradiation apparatus of the present invention is used in the laser annealing process. As the laser oscillator in the laser irradiation apparatus, an excimer laser, a YAG laser, a glass laser, a $YVO_4$ laser, a YLF laser, an Ar laser, or the like may be used.

Figure 9B:
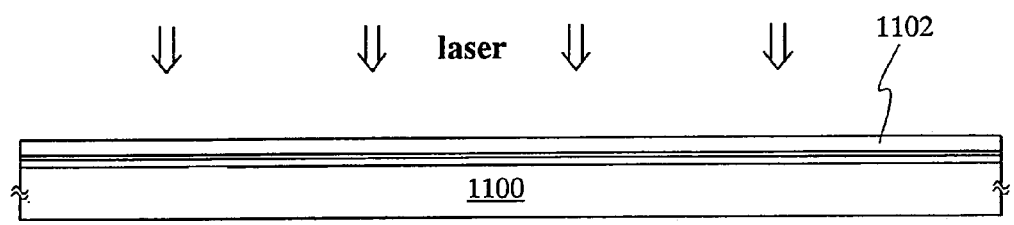

The laser annealing is performed using the laser irradiation apparatus of the present invention to crystallize the amorphous silicon as shown in FIG. 9B. More specifically, the laser annealing may be performed using the method described in any one the embodiments 1 to 3. For example, the laser annealing is performed under the condition where the energy density is set in the range of 200 $mJ/cm^2$ to 1000 $mJ/cm^2$, and the number of shots is set in the range of 10 to 50.

Figure 9C:
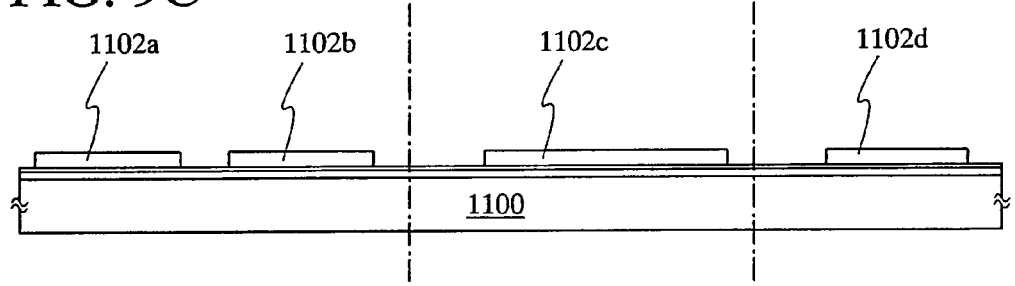
Figure 9D:
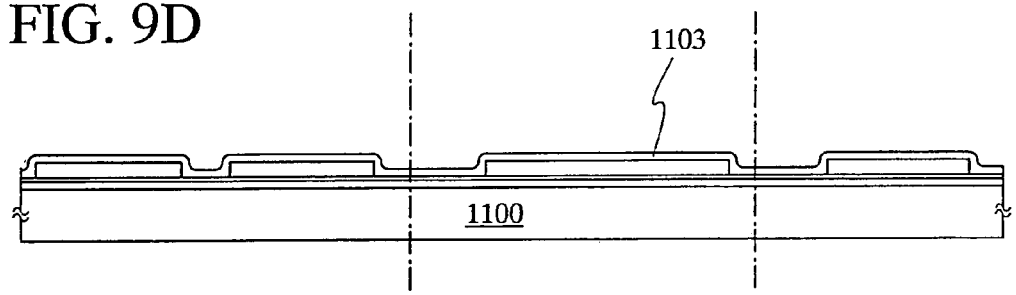

Next, a crystalline semiconductor film is etched to form desired island-shaped crystalline semiconductor layers 1102a to 1102d as shown in FIG. 9C. Then, a gate insulating film 1103 is formed in approximately 115 nm thick using an insulating film including silicon by the low-pressure CVD method, the plasma CVD method, the sputtering method, or the like. A silicon oxide film is formed in this embodiment. In this case, the silicon oxide film is formed by the plasma CVD method under the condition where TEOS (Tetraethyl Orthosilicate) and $O_2$ are mixed, reaction pressure is set to 40 Pa, a substrate temperature is set in the range of 300° C. to 400° C., and electricity is discharged at a high frequency (13.56 MHz) with an electric density ranging from 0.5 $W/cm^2$ to 0.8 $W/cm^2$. The silicon oxide film thus manufactured obtains a good characteristic as the gate insulating film by a heat treatment at a temperature ranging from 400° C. to 500° C. thereafter.

When the semiconductor film is crystallized using the laser irradiation apparatus of the present invention, it is possible to suppress the inhomogeneity of the crystallinity due to the inhomogeneous intensity distribution of the beam spot, and to obtain the crystalline semiconductor film having superior and uniform characteristic.

Next, a tantalum nitride (TaN) film having a thickness of 30 nm is formed on the gate insulating film as a first conductive layer, and a tungsten (W) film having a thickness of 370 nm is formed thereon as a second conductive layer. The TaN film may be formed by the sputtering method using Ta as a target in the atmosphere of nitrogen. And the W film may be formed by the sputtering method using W as a target. In order to use them as a gate electrode, it is necessary that they have low resistance, and it is preferable to make the resistivity of the W film particularly 20 $\mu\Omega$cm or less. Therefore, it is preferable that the W film is formed by the sputtering method using high-purity W (purity 99.99%) as a target, and moreover very careful attention must be paid when forming the W film so that the impurity may not get mixed thereinto. Thus, it becomes possible to make its resistivity in the range of 9 $\mu\Omega$cm to 20 $\mu\Omega$cm.

Although this embodiment forms the first conductive layer using TaN in 30 nm thick and forms the second conductive layer using W in 370 nm thick, the materials of these conductive layers are not limited to them. Both of the first and the second conductive layers may be formed of the element selected from the group consisting of Ta, W, Ti, Mo, Al, Cu, Cr and Nd, or of a chemical compound material or an alloy material including the above element as its main component. In addition, the semiconductor film, typically a crystalline silicon film, with the impurity such as phosphorus doped may be also employed. Moreover, AgPdCu alloy can be also used. Furthermore, the combination of these may be employed. The film thickness of the first conductive layer is preferably in the range of 20 nm to 100 nm, and that of the second conductive layer is preferably in the range of 100 nm to 400 nm. Although the present embodiment shows the two-layers structure, the conductive layer may be formed in a single-layer structure or a laminated-layer structure of three or more layers.

Next, a resist mask 1201 is formed through an exposure process according to a photolithography method. Then, an electrode and a wiring are formed by etching the conductive layers using the resist mask 1201. The first etching process is performed under first and second etching conditions. The etching is performed using the resist mask to form a gate electrode and a wiring. The etching conditions are selected appropriately.

An ICP (Inductively Coupled Plasma) etching method is employed as the first etching process in this embodiment. The etching process is performed under the first etching conditions in which $CF_4$, $Cl_2$, and $O_2$ are used as the etching gas at a flow rate of the gases of 25/25/10 sccm respectively, and plasma is generated by applying RF (13.56 MHz) electric power of 500 W to a coil shaped electrode at a pressure of 1.0 Pa. RF (13.56 MHz) electric power of 150 W is also applied to the substrate side (sample stage), and substantially a negative self-bias voltage is applied. The W film is etched under the first etching conditions, and the edge portions of the first conductive layer are made into a tapered shape. The W film is etched at an etching rate of 200 nm/min and the TaN film is etched at an etching rate of 80 nm/min under the first etching conditions, and the selection ratio of W to TaN is approximately 2.5. The tapered angle of the W film is approximately 26° according to the first etching condition.

Next, the etching process is performed under the second etching condition. In the second etching condition, $CF_4$ and $Cl_2$ are used as the etching gas at a flow rate of gases of 30/30 sccm respectively and plasma is generated by applying RF (13.56 MHz) electric power of 500 W to a coil shaped electrode at a pressure of 1.0 Pa. Then the etching process is performed for about 15 seconds. RF (13.56 MHz) electric power of 20 W is also applied to the substrate side (sample stage), and thereby substantially a negative self-bias voltage is applied. Under the second etching condition using the mixed gas of $CF_4$ and $Cl_2$, the W film and the TaN film are both etched to the same extent.

The W film is etched at an etching rate of 59 nm/min and the TaN film is etched at an etching rate of 66 nm/min under the second etching condition. It is noted that in order to perform the etching process without leaving a residue on the gate insulating film, the time for etching may be increased by approximately 10% to 20%. In the first etching process, the gate insulating film not covered by the electrode is etched by approximately 20 nm to 50 nm.

In the first etching process, the edge portions of the first and the second conductive layers are made into tapered shape due to the effect of the bias voltage applied to the substrate side.

Figure 10A:
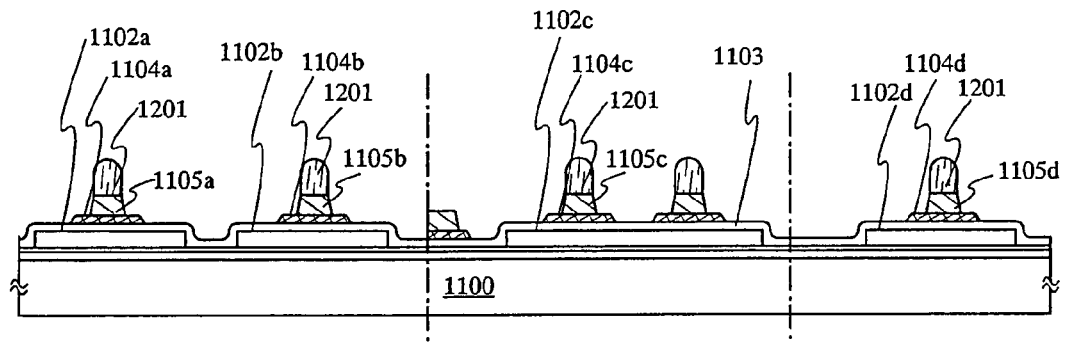
FIGS. 10A to 10D show embodiment 4 of the present invention.

Next, a second etching process is performed without removing the resist mask 1201. The second etching process is performed under the condition in which $SF_6$, $Cl_2$, and $O_2$ are used as the etching gas at a flow rate of gases of 24/12/24 sccm respectively and plasma is generated by applying RF (13.56 MHz) electric power of 700 W to a coil shaped electrode at a pressure of 1.3 Pa. Thus, the etching is performed for approximately 25 seconds. RF (13.56 MHz) electric power of 10 W is also applied to the substrate side, and thereby substantially a negative self-bias voltage is applied. In this etching condition, the W film is etched selectively and a second conductive layer is formed. On the other hand, the first conductive layer is then hardly etched. The first and the second etching processes form a gate electrode including first conductive layers 1104*a* to 1104*d* and second conductive layers 1105*a* to 1105*d* as shown in FIG. 10A.

Figure 10B:
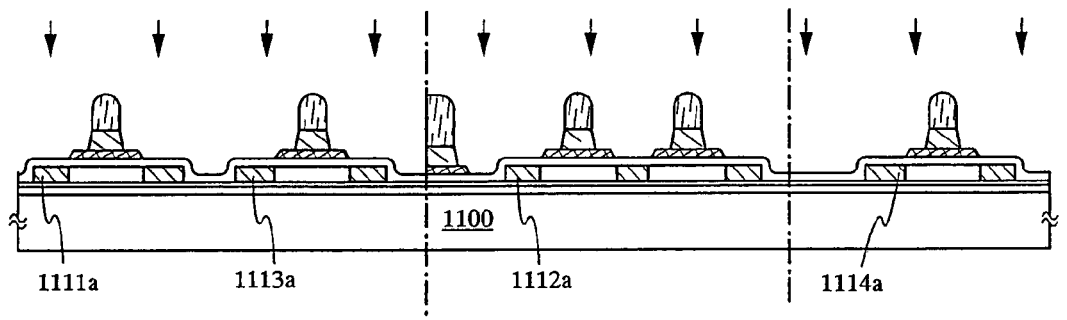

Then, a first doping process is performed without removing the resist mask 1201 as shown in FIG. 10B. The impurity element imparting n-type is doped in the crystalline semiconductor layer at low concentration through the first doping process. The first doping process may be performed by an ion doping method or an ion implantation method. The ion doping method is performed under the condition in which the dosage ranges from $1\times10^{13}$ ions/cm$^2$ to $5\times10^{14}$ ions/cm$^2$, and the acceleration voltage ranges from 40 kV to 80 kV. In this embodiment, the acceleration voltage is set to 50 kV. The 15th element in the periodic table, typically phosphorus (P) or arsenic (As), can be used as an impurity element imparting n-type. Phosphorus (P) is used in this embodiment. On this occasion, the first conductive layer is used as a mask to form first impurity regions ($N^-$ region) 1111*a* to 1114*a* in which the impurity is added at low concentration in a self-aligning manner.

Figure 10C:
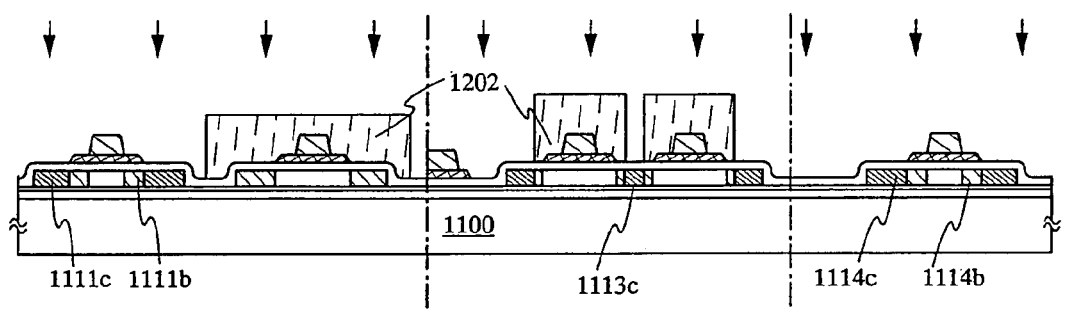

Next, the resist mask 1201 is removed and then a resist mask 1202 is newly formed. As shown in FIG. 10C, a second doping process is performed at higher acceleration voltage than the first doping process. The impurity imparting n-type is also added in the second doping process. The ion doping method is performed under the condition where the dosage is set in the range of $1\times10^{13}$ ions/cm$^2$ to $3\times10^{15}$ ions/cm$^2$ and the acceleration voltage is set in the range of 60 kV to 120 kV. In this embodiment, the dosage is set to $3.0\times10^{15}$ ions/cm$^2$ and the acceleration voltage is set to 65 kV. The second conductive layer is used as the mask against the impurity element in the second doping process, and the doping process is performed so that the impurity element is also added in the semiconductor layer that is positioned below the first conductive layer.

In the second doping process, second impurity regions ($N^-$ region, Lov region) 1111*b* and 1114*b* is formed in the part of the crystalline semiconductor layer that is not overlapped with the second conductive layer or that is not covered by the mask but that is overlapped with the first conductive layer. The impurity imparting n-type is added at concentrations ranging from $1\times10^{18}$ atoms/cm$^3$ to $5\times10^{19}$ atoms/cm$^3$ in the second impurity regions. In addition, the impurity imparting n-type is added at high concentrations ranging from $1\times10^{19}$ atoms/cm$^3$ to $5\times10^{21}$ atoms/cm$^3$ in the part of the crystalline semiconductor film that is exposed without being covered by the first conductive layer and the mask (this part is third impurity regions 1111*c*, 1113*c* and 1114*c*: $N^+$ region). Moreover, the $N^+$ region exists in the semiconductor layer and it is partially covered by the mask 1202. The concentration of the impurity imparting n-type in this part covered by the mask 1202 is the same as that when the first doping process is performed, and therefore this part is still referred to as the first impurity region ($N^-$ region).

Although each impurity region is formed by performing the doping process twice in the present embodiment, the present invention is not limited to this, and the impurity regions having a desired impurity concentration may be formed by performing the doping process once or plural times under the condition determined appropriately.

Figure 10D:
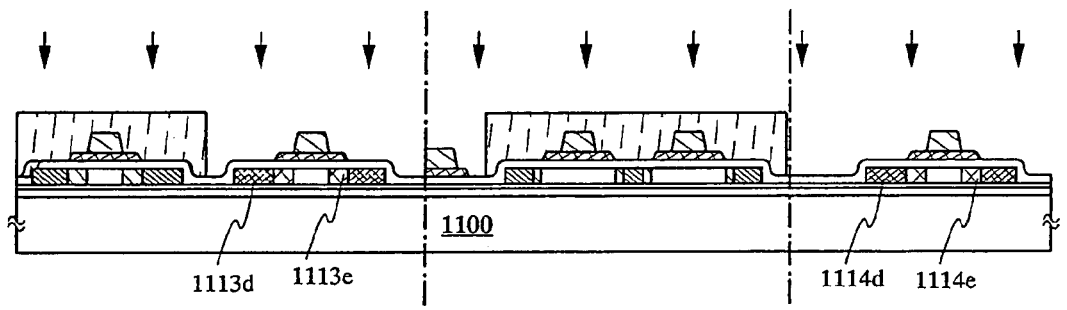

Next, after removing the resist mask 1202, a resist mask 1203 is newly formed to perform a third doping process as shown in FIG. 10D. The third doping process forms fourth impurity regions ($P^+$ region) 1112*d* and 1114*d* and fifth impurity regions ($P^-$ region) 1112*e* and 1114*e* in which the impurity element imparting conductivity type opposite to the first and second conductivity types is added to the semiconductor layer to form p-channel TFT.

In the third doping process, fourth impurity regions ($P^+$ region) 1113*d* and 1114*d* is formed in the part of the crystalline semiconductor layer that is not covered by the resist mask 1203 and that is not overlapped with the first conductive layer. And fifth impurity regions ($P^-$ region) 1113*e* and 1114*e* is formed in the part that is not covered by the resist mask 1203 and that is not overlapped with the second conductive layer but that is overlapped with the first conductive layer. As the impurity element imparting p-type, the 13th element in the periodic table such as boron (B), aluminum (Al), gallium (Ga), or the like is known.

In the present embodiment, boron (B) is used as the impurity element imparting p-type to form the fourth impurity regions 1113*d* and 1114*d* and the fifth impurity regions 1113*e* and 1114*e*, and the ion doping method is performed using diborane ($B_2H_6$) under the condition where the dosage is set to $1\times10^{16}$ ions/cm$^2$ and the acceleration voltage is set to 80 kV.

It is noted that the semiconductor layers to form n-channel TFT are covered by the resist mask 1202 through the third doping process.

Here, phosphorus is added in the fourth impurity regions ($P^+$ region) 1113*d* and 1114*d* and the fifth impurity regions ($P^-$ region) 1113*e* and 1114*e* at the different concentrations respectively by the first and the second doping processes. However, the third doping process is performed so that the concentration of the impurity element imparting p-type ranges from $1\times10^{19}$ atoms/cm$^3$ to $5\times10^{21}$ atoms/cm$^3$ in the fourth impurity regions ($P^+$ region) 1113*d* and 1114*d* and the fifth impurity regions ($P^-$ region) 1113*e* and 1114*e*. Therefore, the fourth impurity regions ($P^+$ region) 1113*d* and 1114*d* and the fifth impurity regions ($P^-$ region) 1113*e* and 1114*e* work as source regions and drain regions of the p-channel TFT without any problems.

Although the present embodiment forms the fourth impurity regions ($P^+$ region) 1113*d* and 1114*d* and the fifth impurity regions (P⁻ region) 1113e and 1114e by performing the third doping process once, the present invention is not limited this. The fourth impurity region (P⁺ region) and the fifth impurity region (P⁻ region) may be formed by performing the doping process plural times appropriately according to the condition in the doping process.

These doping processes form the first impurity region (N⁻ region) 1112a, the second impurity region (N⁻ region, Lov region) 1111b, the third impurity regions (N⁺ region) 1111c and 1113c, the fourth impurity regions (P⁺ region) 1113d and 1114d, and the fifth impurity regions (P⁻ region) 1113e and 1114e.

Figure 11A:
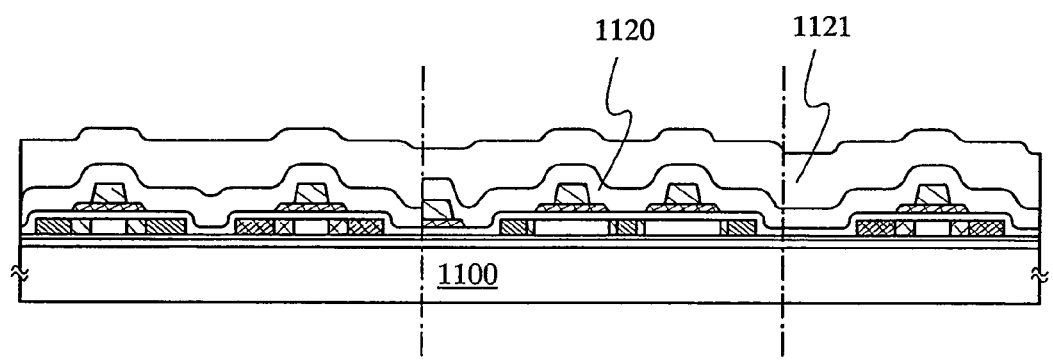
FIGS. 11A and 11B show embodiment 4 of the present invention.

Next, the resist mask 1203 is removed and a first passivation film 1120 is formed as shown in FIG. 11A. An insulating film including silicon is formed in a thickness from 100 nm to 200 nm as the first passivation film. A plasma CVD method or a sputtering method may be employed as the film-forming method. In the present embodiment, a silicon oxynitride film is formed in 100 nm thick by the plasma CVD method. The silicon oxynitride film may be formed by the plasma CVD method using $SiH_4$, $N_2O$, and $NH_3$, or using $SiH_4$ and $N_2O$. These films are manufactured under the condition where the reaction pressure is set in the range of 20 Pa to 200 Pa, the substrate temperature is set in the range of 300° C. to 400° C., and electrical density is set in the range of 0.1 W/cm² to 1.0 W/cm² at high frequency (60 MHz). In addition, a silicon oxynitride hydride film manufactured using $SiH_4$, $N_2O$, and $H_2$ may be applied as the first passivation film. Of course, the first passivation film 1120 may be formed not only in the single-layer structure using the silicon oxynitride film as shown in this embodiment, but also in the single-layer structure or in the laminated-layer structure using another insulating film including silicon.

After that, the laser annealing is performed using the laser irradiation apparatus of the present invention to recover the crystallinity of the semiconductor layer and to activate the impurity element added in the semiconductor layer. For example, the laser annealing is performed under the condition where the energy density is set in the range of 100 mJ/cm² to 1000 mJ/cm² and the number of shots is set in the range of 10 to 50. Not only the laser annealing, but also a heat treatment or a rapid thermal annealing (RTA) can be applied.

When the heat treatment is performed after forming the first passivation film 1120, the hydrogenation of the semiconductor layer can be performed at the same time as the activation. The hydrogenation is to terminate the dangling bond of the semiconductor layer by the hydrogen included in the first passivation film.

Alternatively, the heat treatment may be performed before forming the first passivation film 1120. However, when the materials of the first conductive layers 1104a to 1104d and the second conductive layers 1105a to 1105d do not have enough resistance against the heat, the heat treatment is preferably performed after forming the first passivation film 1120 in order to protect the wiring as shown in the present embodiment. When the heat treatment is performed before forming the first passivation film 1120, since the passivation film does not exist in the heat treatment, the hydrogenation utilizing the hydrogen included in the passivation film cannot be performed.

In this case, the hydrogenation is performed by using hydrogen excited by plasma (plasma hydrogenation) or by heating in the atmosphere including hydrogen for 3% to 100% at temperatures ranging from 300° C. to 450° C. for 1 hour to 12 hours.

Next, a first interlayer insulating film 1121 is formed on the first passivation film 1120. An inorganic insulating film or an organic insulating film may be used as the first interlayer insulating film. A silicon oxide film formed by the CVD method or a silicon oxide film applied by an SOG (Spin On Glass) method can be used as the inorganic insulating film. A film of polyimide, polyamide, BCB (benzocyclobutene), acrylic, positive photosensitive organic resin, negative photosensitive organic resin, or the like can be used as the organic insulating film. A laminated-layer structure of an acrylic film and a silicon oxynitride film may be also used.

In addition, the interlayer insulating film can be formed of the material in which the framework structure is constituted by the bond of silicon (Si) and oxygen (O), and which includes at least hydrogen in the substituent. Moreover, the interlayer insulating film can be formed of the material having at least one of fluorine, alkyl, and aromatic hydrocarbon in the substituent. Siloxane polymer can be given as the typical example of such a material.

Siloxane polymer can be classified into silica glass, alkylsiloxane polymer, alkylsilsesquioxane polymer, silsesquioxane hydride polymer, alkylsilsesquioxane hydride polymer, and the like according to the structure.

Alternatively, the interlayer insulating film may be formed using the material including polymer having Si—N bond (polysilazane).

Although the film is made so thinly, the interlayer insulating film can maintain its enough flatness and high insulating characteristic by employing the above material. Moreover, because the above material has high resistance against the heat, the interlayer insulating film that can resist a reflow process in a multi-layer wiring can be obtained. Furthermore, because it has low moisture-absorption characteristic, it is possible to form the interlayer insulating film having less dewatering volume.

A non-photosensitive acrylic film is formed in 1.6 μm thick in the present embodiment. The first interlayer insulating film can decrease and flatten the concavity and convexity due to TFT formed over the substrate. Since the first interlayer insulating film is formed particularly for the purpose of flattening, it is preferable to use the insulating film formed of the material that can be easily flattened.

After that, a second passivation film is formed using a silicon nitride oxide film on the first interlayer insulating film. The film thickness is preferable in the range of approximately 10 nm to 200 nm, and the second passivation film prevents the moisture from penetrating into the first interlayer insulating film. Not only the silicon nitride oxide film but also a silicon nitride film, an aluminum nitride film, an aluminum oxynitride film, a diamond like carbon (DLC) film, or a carbon nitride (CN) film can be used.

The film formed by an RF sputtering method is a highly dense film and is superior in the barrier property. In the case of forming a silicon oxynitride film, for example, the RF sputtering is performed under the condition where Si is used as a target, $N_2$, Ar, and $N_2O$ are flowed at gas flow ratio of 31:5:4, the pressure is set to 0.4 Pa, and the electric power is set to 3000 W. In the case of forming a silicon nitride film, for example, Si is used as a target, $N_2$ and Ar are flowed at gas flow ratio of 1:1 in the chamber, the pressure is set to 0.8 Pa, the electric power is set to 3000 W, and the film-forming temperature is set to 215° C. In the present embodiment, the RF sputtering method is used to form a silicon oxynitride film in 70 nm thick.

Subsequently, the second passivation film, the first interlayer insulating film, and the first passivation film are etched to form a contact hole that contacts the third and the fourth impurity regions.

Figure 11B:
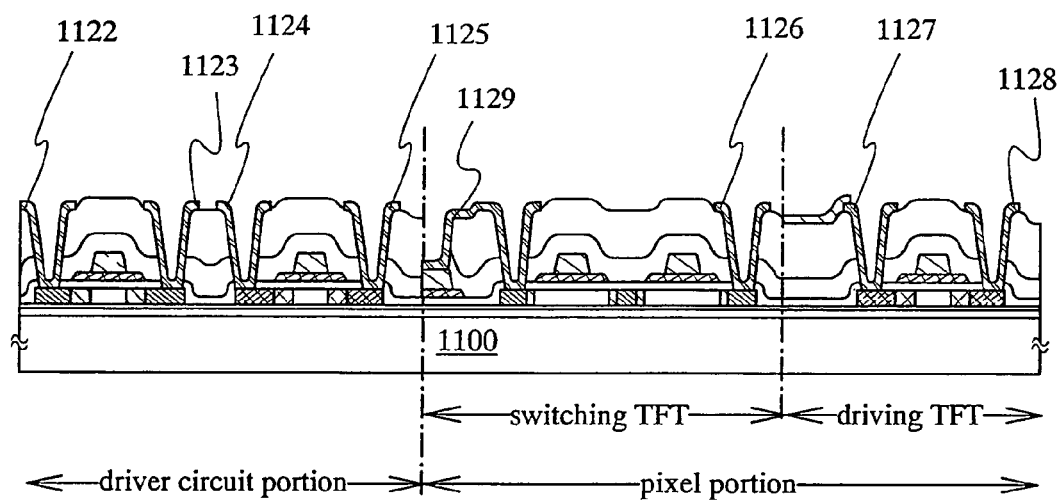

Next, wirings 1122 to 1128 to connect electrically with the respective impurity regions are formed as shown in FIG. 11B. It is noted that these wirings are formed by patterning the laminated film of a Ti film having a thickness of 50 nm and an alloy film (Al and Ti) having a thickness of 500 nm. Of course, the wiring may be formed not only in a two-layers structure but also in a single-layer structure or in a laminated-layer structure of three or more layers. In addition, the wiring material is not limited to Al and Ti. For example, the wiring may be formed by patterning a laminated film in which an Al film or a Cu film is formed on the TaN film, and then a Ti film is further formed thereon.

EMBODIMENT 5

A semiconductor device manufactured using the laser irradiation apparatus shown in the embodiments 1 to 3 (particularly a display device (a liquid crystal display device, an EL display device, or the like)) can be applied to various electronic instruments. As the electronic instruments to which the semiconductor device can be applied, there are a television device, a video camera, a digital camera, a goggle type display (a head mounted display), a navigation system, a sound reproduction device (a car audio, an audio component system, and the like), a personal computer, a game machine, a personal digital assistant (a mobile computer, a mobile phone, a mobile game machine, an electronic book, and the like), an image reproduction device equipped with a recording medium (specifically a device equipped with a display that can play a recording medium such as a Digital Versatile Disc (DVD), and can display the image), and the like. FIGS. 12A to 12H show the examples of these electronic instruments.

Figure 12A:
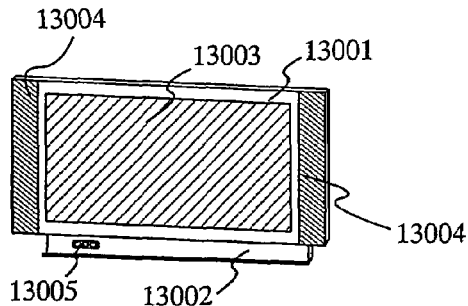
FIGS. 12A to 12H show the embodiment 5 of the present invention.

FIG. 12A shows a television device including a chassis 13001, a supporting stand 13002, a display portion 13003, speaker portions 13004, a video input terminal 13005, and the like. The laser irradiation apparatus shown in the embodiments 1 to 3 can be used to manufacture the display portion 13003 and the like, and can complete the television device. An EL display or a liquid crystal display can be used as the display portion 13003. It is noted that the television device includes all kinds of television devices for a computer, for a television broadcasting receive, for advertisement, and the like.

Figure 12B:
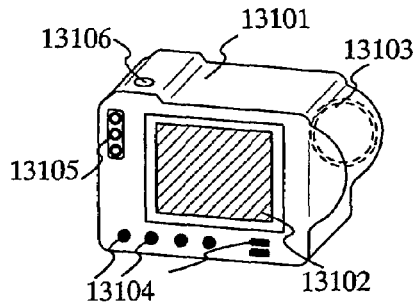

FIG. 12B shows a digital camera including a main body 13101, a display portion 13102, an image receiving portion 13103, operation keys 13104, an external connection port 13105, a shutter 13106, and the like. The laser irradiation apparatus shown in the embodiments 1 to 3 can be used to manufacture the display portion 13102 and the like, and can complete the digital camera.

Figure 12C:
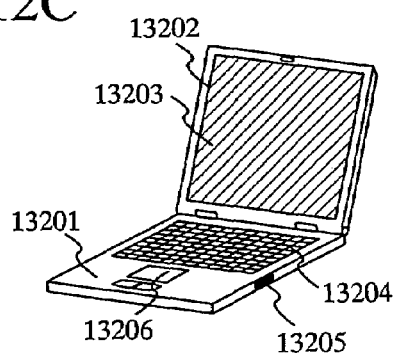

FIG. 12C shows a computer including a main body 13201, a chassis 13202, a display portion 13203, a keyboard 13204, an external connection port 13205, a pointing mouse 13206, and the like. The laser irradiation apparatus shown in the embodiments 1 to 3 can be used to manufacture the display portion 13203 and the like, and can complete the computer.

Figure 12D:
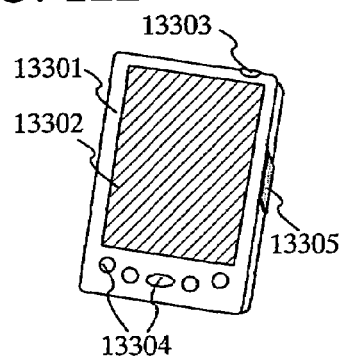

FIG. 12D shows a mobile computer including a main body 13301, a display portion 13302, a switch 13303, operation keys 13304, an infrared radiation port 13305, and the like. The laser irradiation apparatus shown in the embodiments 1 to 3 can be used to manufacture the display portion 13302 and the like, and can complete the mobile computer.

Figure 12E:
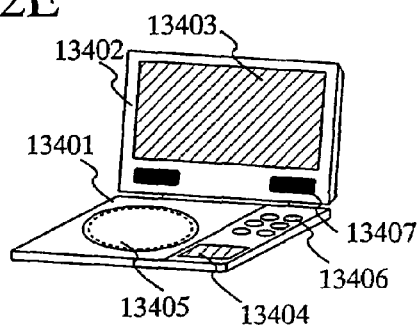

FIG. 12E shows an image reproduction device equipped with the recording medium (this device is a DVD player specifically) including a main body 13401, a chassis 13402, a display portion A 13403, a display portion B 13404, a recording medium (for example, DVD) reader 13405, an operation key 13406, a speaker portion 13407, and the like. The display portion A 13403 mainly displays the image information while the display portion B 13404 mainly displays textual information. The laser irradiation apparatus shown in the embodiments 1 to 3 can be used to manufacture the display portions A 13403 and B 13404, and the like. Thus, the image reproduction device can be completed. It is noted that the image reproduction device with the recording medium equipped includes the game machine and the like.

Figure 12F:
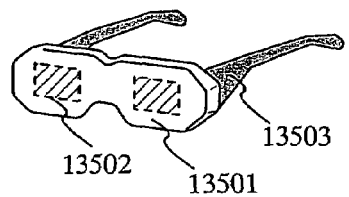

FIG. 12F shows a goggle type display (head mounted display) including a main body 13501, display portions 13502, and arm portions 13503. The laser irradiation apparatus shown in the embodiments 1 to 3 can be used to manufacture the display portions 13502 and the like, and can complete the goggle type display.

Figure 12G:
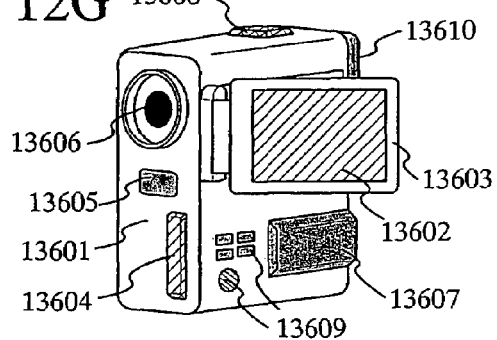

FIG. 12G is a video camera including a main body 13601, a display portion 13602, a chassis 13603, an external connection port 13604, a remote control receiver 13605, an image receiver 13606, a battery 13607, an audio input portion 13608, operation keys 13609, an eyepiece portion 13610, and the like. The laser irradiation apparatus shown in the embodiments 1 to 3 can be used to manufacture the display portion 13602 and the like, and can complete the video camera.

Figure 12H:
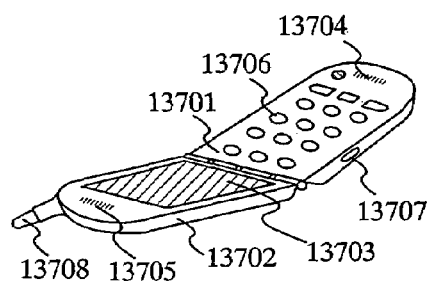

FIG. 12H shows a mobile phone including a main body 13701, a chassis 13702, a display portion 13703, an audio input portion 13704, an audio output portion 13705, operation keys 13706, an external connection port 13707, an antenna 13708, and the like. The laser irradiation apparatus shown in the embodiments 1 to 3 can be used to manufacture the display portion 13703 and the like, and can complete the mobile phone. When the display portion 13703 displays white letters on black background, the mobile phone consumes less power.

The display devices used in the display portions of these electronic instruments have the thin film transistor for driving the pixel. And the laser irradiation apparatus shown in the embodiments 1 to 3 can be used to crystallize the semiconductor film used in the thin film transistor. In the case where the display device used in the display portion of the electronic instruments requires high precision and high crystallinity as the EL display device, it is possible to manufacture the electronic instruments having the display portion with the display unevenness further reduced by crystallizing the semiconductor film using the laser irradiation apparatus shown in the embodiments 1 to 3.

As described above, the range of application of the semiconductor device manufactured by the laser irradiation apparatus of the present invention is extremely wide, and the semiconductor device can be applied in the electronic instruments of every field.

What is claimed is:
1. A laser irradiation method comprising:
 dividing a laser beam in a first direction by a lens array;
 combining divided laser beams by a first lens;
 propagating a combined laser beam in an optical waveguide to homogenize intensity distribution of the laser beam in the first direction;

condensing a laser beam propagated in the optical waveguide to an irradiated surface by a second lens; and irradiating an object with a condensed laser beam, wherein the first lens is arranged so that the divided laser beams are condensed at a plurality of points between the first lens and the optical waveguide, and wherein the optical waveguide has at least one pair of reflection planes provided oppositely.

2. The laser irradiation method according to claim 1, further comprising a step of:

dividing and combining the laser beam in a second direction perpendicular to the first direction.

3. The laser irradiation method according to claim 1, wherein the laser beam is one of the group consisting of an excimer laser beam, a YAG laser beam, and a glass laser beam.

4. The laser irradiation method according to claim 1, wherein the laser beam is one of the group consisting of a $YVO_4$ laser beam, a YLF laser beam, and an Ar laser beam.

5. The laser irradiation method according to claim 1, wherein the lens array is a cylindrical lens array or a fly-eye lens.

6. The laser irradiation method according to claim 1, wherein the first lens comprises a convex cylindrical lens.

7. The laser irradiation method according to claim 1, wherein the second lens comprises a convex cylindrical lens.

8. The laser irradiation method according to claim 1, wherein the optical waveguide has a region occupied by a medium having a refractive index equal to or more than 1.

9. The laser irradiation method according to claim 1, wherein the laser beam incident into the optical waveguide is totally reflected at the reflection planes repeatedly and reaches the exit.

10. A laser irradiation method comprising:

dividing a laser beam in a first direction by a lens array;

combining divided laser beams by a first lens;

passing a combined laser beam through an optical waveguide having at least one pair of reflection planes provided oppositely so that the combined laser beam reflects at the reflection planes;

condensing a laser beam passed through the optical waveguide to an irradiated surface by a second lens; and irradiating an object with a condensed laser beam, wherein the first lens is arranged so that the divided laser beams are condensed at a plurality of points between the first lens and the optical waveguide.

11. The laser irradiation method according to claim 10, further comprising a step of:

dividing and combining the laser beam in a second direction perpendicular to the first direction.

12. The laser irradiation method according to claim 10, wherein the laser beam is one of the group consisting of an excimer laser beam, a YAG laser beam, and a glass laser beam.

13. The laser irradiation method according to claim 10, wherein the laser beam is one of the group consisting of a $YVO_4$ laser beam, a YLF laser beam, and an Ar laser beam.

14. The laser irradiation method according to claim 10, wherein the lens array is a cylindrical lens array or a fly-eye lens.

15. The laser irradiation method according to claim 10, wherein the first lens comprises a convex cylindrical lens.

16. The laser irradiation method according to claim 10, wherein the second lens comprises a convex cylindrical lens.

17. The laser irradiation method according to claim 10, wherein the optical waveguide has a region occupied by a medium having a refractive index equal to or more than 1.

18. The laser irradiation method according to claim 10, wherein the laser beam incident into the optical waveguide is totally reflected at the reflection planes repeatedly and reaches the exit.

19. A method for manufacturing a semiconductor device comprising:

dividing a laser beam in a first direction by a lens array;

combining divided laser beams by a first lens;

propagating a combined laser beam in an optical waveguide to homogenize intensity distribution of the laser beam in the first direction;

condensing a laser beam propagated in the optical waveguide to an irradiated surface of a semiconductor film by a second lens; and irradiating the semiconductor film with a condensed laser beam, wherein the first lens is arranged so that the divided laser beams are condensed at a plurality of points between the first lens and the optical waveguide, and wherein the optical waveguide has at least one pair of reflection planes provided oppositely.

20. The method for manufacturing a semiconductor device according to claim 19, further comprising a step of:

dividing and combining the laser beam in a second direction perpendicular to the first direction.

21. The method for manufacturing a semiconductor device according to claim 19, wherein the laser beam is one of the group consisting of an excimer laser beam, a YAG laser beam, and a glass laser beam.

22. The method for manufacturing a semiconductor device according to claim 19, wherein the laser beam is one of the group consisting of a $YVO_4$ laser beam, a YLF laser beam, and an Ar laser beam.

23. The method for manufacturing a semiconductor device according to claim 19, wherein the lens array is a cylindrical lens array or a fly-eye lens.

24. The method for manufacturing a semiconductor device according to claim 19, wherein the first lens comprises a convex cylindrical lens.

25. The method for manufacturing a semiconductor device according to claim 19, wherein the second lens comprises a convex cylindrical lens.

26. The method for manufacturing a semiconductor device according to claim 19, wherein the optical waveguide has a region occupied by a medium having a refractive index equal to or more than 1.

27. The method for manufacturing a semiconductor device according to claim 19, wherein the laser beam incident into the optical waveguide is totally reflected at the reflection planes repeatedly and reaches the exit.

28. The method for manufacturing a semiconductor device according to claim 19, wherein the semiconductor film is crystallized by irradiating the semiconductor film with the condensed laser beam.

29. The method for manufacturing a semiconductor device according to claim 19, wherein the semiconductor device is a display device.

30. A method for manufacturing a semiconductor device comprising:

dividing a laser beam in a first direction by a lens array;

combining divided laser beams by a first lens;

passing a combined laser beam through an optical waveguide having at least one pair of reflection planes provided oppositely so that the combined laser beam reflects at the reflection planes;

condensing a laser beam passed through the optical waveguide to an irradiated surface of a semiconductor film by a second lens; and irradiating the semiconductor film with a condensed laser beam, wherein the first lens is arranged so that the divided laser beams are condensed at a plurality of points between the first lens and the optical waveguide.

31. The method for manufacturing a semiconductor device according to claim 30, further comprising a step of:

dividing and combining the laser beam in a second direction perpendicular to the first direction.

32. The method for manufacturing a semiconductor device according to claim 30, wherein the laser beam is one of the group consisting of an excimer laser beam, a YAG laser beam, and a glass laser beam.

33. The method for manufacturing a semiconductor device according to claim 30, wherein the laser beam is one of the group consisting of a $YVO_4$ laser beam, a YLF laser beam, and an Ar laser beam.

34. The method for manufacturing a semiconductor device according to claim 30, wherein the lens array is a cylindrical lens array or a fly-eye lens.

35. The method for manufacturing a semiconductor device according to claim 30, wherein the first lens comprises a convex cylindrical lens.

36. The method for manufacturing a semiconductor device according to claim 30, wherein the second lens comprises a convex cylindrical lens.

37. The method for manufacturing a semiconductor device according to claim 30, wherein the optical waveguide has a region occupied by a medium having a refractive index equal to or more than 1.

38. The method for manufacturing a semiconductor device according to claim 30, wherein the laser beam incident into the optical waveguide is totally reflected at the reflection planes repeatedly and reaches the exit.

39. The method for manufacturing a semiconductor device according to claim 30, wherein the semiconductor film is crystallized by irradiating the semiconductor film with the condensed laser beam.

40. The method for manufacturing a semiconductor device according to claim 30, wherein the semiconductor device is a display device.

* * * * *